(12) United States Patent
Do et al.

(10) Patent No.: US 11,335,673 B2
(45) Date of Patent: May 17, 2022

(54) INTEGRATED CIRCUITS HAVING CROSS-COUPLE CONSTRUCTS AND SEMICONDUCTOR DEVICES INCLUDING INTEGRATED CIRCUITS

(71) Applicant: Samsung Electronics Co., Ltd., Suwon-si (KR)

(72) Inventors: Jung-Ho Do, Hwaseong-si (KR); Dal-Hee Lee, Seoul (KR); Jin-Young Lim, Seoul (KR); Tae-Joong Song, Seongnam-si (KR); Jong-Hoon Jung, Seongnam-si (KR)

(73) Assignee: Samsung Electronics Co., Ltd.

( * ) Notice: Subject to any disclaimer, the term of this patent is extended or adjusted under 35 U.S.C. 154(b) by 338 days.

(21) Appl. No.: 16/191,720

(22) Filed: Nov. 15, 2018

(65) Prior Publication Data

US 2019/0198491 A1 Jun. 27, 2019

(30) Foreign Application Priority Data

Dec. 22, 2017 (KR) .................. 10-2017-0178738

(51) Int. Cl.
| | |
|---|---|
| *H01L 27/02* | (2006.01) |
| *H01L 27/118* | (2006.01) |
| *G11C 5/06* | (2006.01) |
| *G06F 30/00* | (2020.01) |
| *G11C 8/16* | (2006.01) |
| *G11C 11/412* | (2006.01) |
| *H01L 21/768* | (2006.01) |
| *H01L 27/088* | (2006.01) |

(52) U.S. Cl.
CPC .......... *H01L 27/0207* (2013.01); *G06F 30/00* (2020.01); *G11C 5/063* (2013.01); *G11C 8/16* (2013.01); *G11C 11/412* (2013.01); *H01L 21/76895* (2013.01); *H01L 27/088* (2013.01); *H01L 27/11807* (2013.01); *H01L 2027/11875* (2013.01)

(58) Field of Classification Search
CPC ......... H01L 27/0207; H01L 21/823475; H01L 21/823437; H01L 23/528; H01L 29/66545
See application file for complete search history.

(56) References Cited

U.S. PATENT DOCUMENTS

| | | | |
|---|---|---|---|
| 8,045,402 | B2 | 10/2011 | Yeung |
| 8,455,354 | B2 | 6/2013 | Chen et al. |

(Continued)

FOREIGN PATENT DOCUMENTS

| | | |
|---|---|---|
| KR | 20160003978 A | 1/2016 |
| KR | 20160120644 A | 10/2016 |

*Primary Examiner* — Eric K Ashbahian
(74) *Attorney, Agent, or Firm* — Myers Bigel, P.A.

(57) ABSTRACT

An integrated circuit may include a first active region and a second active region, and the first and second active regions may extend on a substrate in a first horizontal direction in parallel to each other and have different conductivity types from each other. A first gate line may extend in a second horizontal direction crossing the first horizontal direction, and may form a first transistor with the first active region. The first transistor may include a gate to which a first input signal is applied. The first gate line may include a first partial gate line that overlaps the first active region in a perpendicular direction and that has an end on a region between the first and second active regions.

11 Claims, 22 Drawing Sheets

(56) References Cited

U.S. PATENT DOCUMENTS

| | | |
|---|---|---|
| 8,679,911 B2 | 3/2014 | Wang et al. |
| 8,741,763 B2 | 6/2014 | Ma et al. |
| 8,856,704 B2 | 10/2014 | Baeg |
| 9,431,381 B2 | 8/2016 | Hsieh et al. |
| 9,431,383 B2 * | 8/2016 | Baek .................... H01L 27/0924 |
| 9,589,899 B2 | 3/2017 | Jun et al. |
| 9,704,862 B2 | 7/2017 | Park et al. |
| 2014/0332871 A1 * | 11/2014 | Kim .................... H01L 23/5221 |
| | | 257/296 |
| 2016/0005851 A1 * | 1/2016 | Song .................... H01L 27/0207 |
| | | 257/401 |
| 2016/0093603 A1 * | 3/2016 | Hsieh .................... H01L 27/092 |
| | | 257/369 |
| 2016/0110489 A1 * | 4/2016 | Schroeder ............. G06F 30/392 |
| | | 716/119 |
| 2016/0225767 A1 * | 8/2016 | Liu ................. H01L 21/823871 |
| 2017/0006607 A1 | 1/2017 | Kamran et al. |
| 2017/0018620 A1 * | 1/2017 | Liu ................. H01L 21/823871 |

\* cited by examiner

INTEGRATED CIRCUITS HAVING CROSS-COUPLE CONSTRUCTS AND SEMICONDUCTOR DEVICES INCLUDING INTEGRATED CIRCUITS

CROSS-REFERENCE TO RELATED APPLICATION

This application claims the benefit of Korean Patent Application No. 10-2017-0178738, filed on Dec. 22, 2017, in the Korean Intellectual Property Office, the disclosure of which is incorporated by reference herein in its entirety.

TECHNICAL FIELD

The present disclosure relates to integrated circuits, and more particularly, to integrated circuits having cross-couple constructs, and to semiconductor devices that include integrated circuits having cross-couple constructs.

BACKGROUND

In integrated circuits for processing digital signals, cross-couple constructs may be included in various sub-circuits, such as multiplexers, flip-flops, etc. Cross-couple constructs may serve an important role with respect to the performance and power consumption of a standard cell. As semiconductor processes have been miniaturized, not only have transistors included in the integrated circuit been reduced in size, but also interconnections may have reduced sizes. Thus, there may be restrictions on realizing a cross-couple construct providing desired characteristics.

SUMMARY

The present disclosure provides integrated circuits having cross-couple constructs, and more particularly, improved cross-couple constructs, integrated circuits including the improved cross-couple constructs, and semiconductor devices including the integrated circuits including the improved cross-couple constructs.

According to an aspect of the present disclosure, an integrated circuit is provided. The integrated circuit may include: a first active region and a second active region, each extending on a substrate in a first horizontal direction in parallel to each other and having different conductivity types from each other; a first gate line extending in a second horizontal direction crossing the first horizontal direction, the first gate line forming a first transistor with the first active region, the first transistor having a gate to which a first input signal is applied; a second gate line extending in the second horizontal direction and forming a second transistor with the second active region, the second transistor having a gate to which the first input signal is applied; and a third gate line continually extending in the second horizontal direction from the first active region to the second active region, between the first and second gate lines, and forming a third transistor and a fourth transistor with the first and second active regions, respectively, each of the third and fourth transistors having a gate to which a second input signal is applied, wherein the first gate line includes a first partial gate line overlapping the first active region in a perpendicular direction and having an end on a region between the first and second active regions.

According to another aspect of the inventive concepts, there is provided an integrated circuit including: a first active region and a second active region extending on a substrate in a first horizontal direction in parallel to each other and having different conductivity types from each other; a first gate line extending in a second horizontal direction crossing the first horizontal direction, and forming a first transistor with the first active region, the first transistor having a gate to which a first input signal is applied; a second gate line extending in the second horizontal direction and forming a second transistor with the second active region, the second transistor having a gate to which a second input signal is applied; and a third gate line extending in the second horizontal direction between the first and second gate lines, and including a first partial gate line and a second partial gate line, wherein the first partial gate line forms a third transistor with the first active region and the second partial gate line forms a fourth transistor with the second active region, wherein the third transistor has a gate, to which the second input signal is applied, and the fourth transistor has a gate, to which the first input signal is applied; a first source/drain contact extending in the second horizontal direction and having a bottom surface connected to drain regions of the first and third transistors; and a second source/drain contact extending in the second horizontal direction and having a bottom surface connected to drain regions of the second and fourth transistors, wherein the first and second source/drain contacts are electrically connected to each other on a region between the first and second active regions.

According to another aspect of the inventive concepts, there is provided an integrated circuit including: a first active region and a second active region extending on a substrate in a first horizontal direction in parallel to each other and having different conductivity types from each other; a first gate line extending in a second horizontal direction crossing the first horizontal direction, and including a first partial gate line and a second partial gate line, wherein the first partial gate line forms a first transistor with the first active region and the second partial gate line forms a second transistor with the second active region, wherein the first transistor has a gate, to which a first input signal is applied, and the second transistor has a gate, to which a second input signal is applied; and a second gate line extending in the second horizontal direction, and including a third partial gate line and a fourth partial gate line, wherein the third partial gate line forms a third transistor with the first active region and the fourth partial gate line forms a fourth transistor with the second active region, wherein the third transistor has a gate, to which the second input signal is applied, and the fourth transistor has a gate, to which the first input signal is applied, wherein the first and second partial gate lines are spaced apart from each other in the second horizontal direction, and the third and fourth partial gate lines are spaced apart from each other in the second horizontal direction.

BRIEF DESCRIPTION OF THE DRAWINGS

Aspects of the present disclosure, and example embodiments of the inventive concepts disclosed herein, will be more clearly understood from the following detailed description taken in conjunction with the accompanying drawings in which.

DETAILED DESCRIPTION OF THE EMBODIMENTS

Figure 1A:
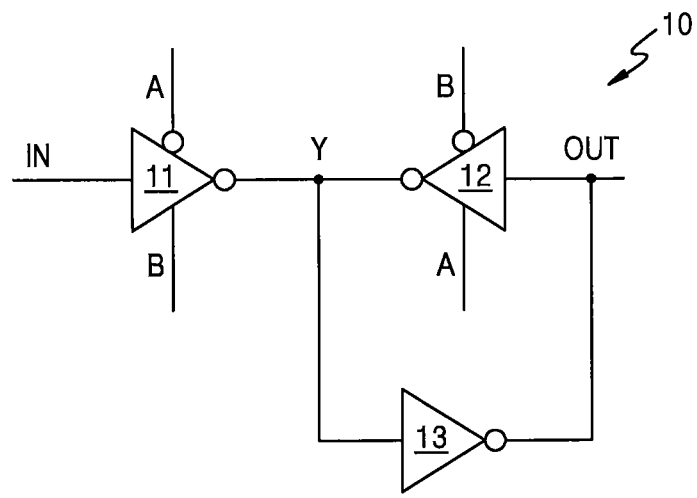
FIGS. 1A and 1B are circuit diagrams showing examples of a circuit including a cross-couple construct.
Figure 1B:
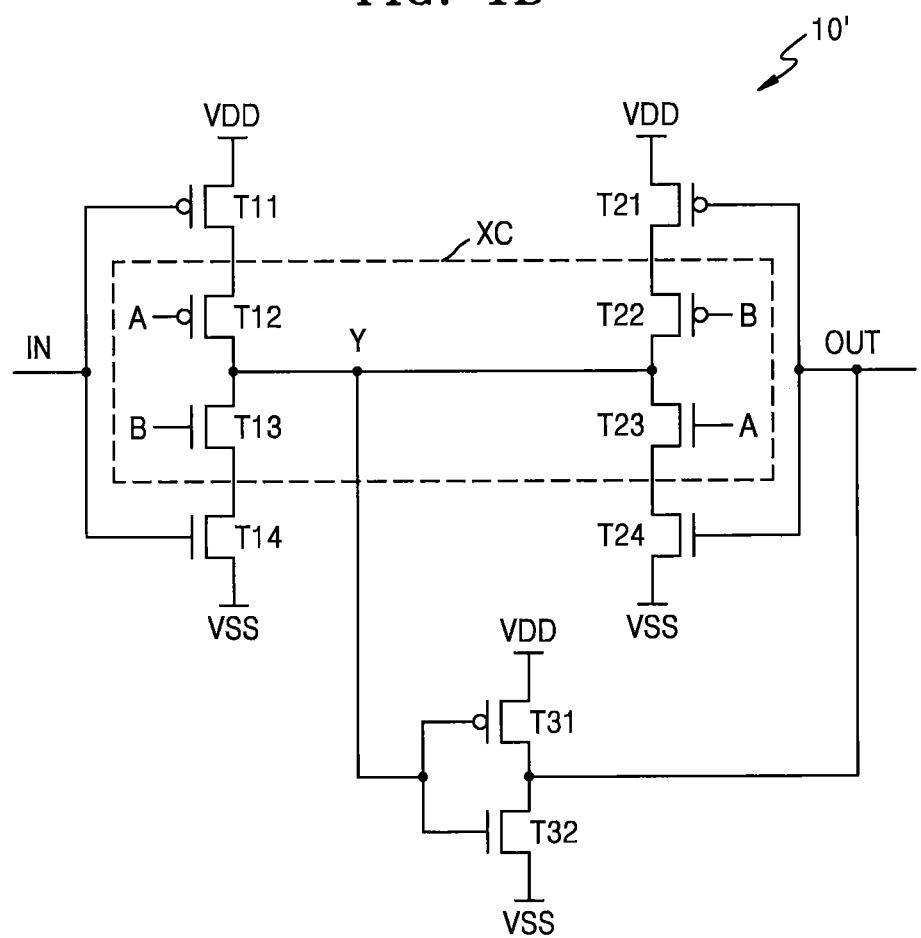

FIGS. 1A and 1B are circuit diagrams showing examples of a circuit including a cross-couple construct, according to an example embodiment of the inventive concepts. Specifically, FIG. 1A shows a latch 10 and FIG. 1B shows an embodiment of the latch 10 of FIG. 1A as latch 10'.

Referring to FIG. 1A, the latch 10 may include a first tri-state buffer 11, a second tri-state buffer 12, and an inverter 13. The first and second tri-state buffers 11 and 12 may be sub-circuits, each of which is configured to generate an output depending on an input and based on control signals, and each of which may be referred to as a transmission gate. In the examples of FIGS. 1A and 1B, the first and second tri-state buffers 11 and 12 may generate an output by inverting an input. For example, the first tri-state buffer 11 may output an internal signal Y by inverting a latch input signal IN in response to a first input signal A having a voltage of a low level and a second input signal B having a voltage of a high level, while maintaining a terminal configured to output the internal signal Y in a high impedance state in response to the first input signal A having a voltage of a high level and the second input signal B having a voltage of a low level, regardless of the latch input signal IN. Similarly, the second tri-state buffer 12 may output the internal signal Y by inverting a latch output signal OUT in response to the second input signal B having a voltage of a low level and the first input signal A having a voltage of a high level, while maintaining a terminal configured to output the internal signal Y in a high impedance state in response to the second input signal B having a voltage of a high level and the first input signal A having a voltage of a low level, regardless of the latch output signal OUT. The inverter 13 may output the latch output signal OUT by inverting the internal signal Y.

In some embodiments, the first input signal A may be a clock signal, the second input signal B may be an inverted clock signal, and at least two latches may be connected in series to form a flip-flop (for example, a master-slave flip-flop). Flip-flops are sub-circuits in an integrated circuit that may be configured to process a digital signal. The integrated circuit may include a plurality of standard cells corresponding to the flip-flops, and characteristics of the standard cells may affect characteristics of the integrated circuit.

Referring to FIG. 1B, the latch 10 of FIG. 1A may be implemented as a latch 10' of FIG. 1B, wherein the latch 10' includes a plurality of transistors. For example, in the latch 10' may be four transistors T11, T12, T13, and T14 of FIG. 1B, the four transistors T11 through T14 being connected in series between a positive supply voltage VDD and a negative supply voltage VSS. The four transistors T11 through T14 may correspond collectively to the first tri-state buffer 11 of FIG. 1A. Four transistors T21, T22, T23, and T24 of FIG. 1B may also be present in the latch 10', and the four transistors T21 through T24 may be connected in series between the positive supply voltage VDD and the negative supply voltage VSS. The four transistors T21 through T24 may correspond collectively to the second tri-state buffer 12 of FIG. 1A. Two transistors T31 and T32 of FIG. 1B, may each have a gate to which the internal signal Y is applied. The transistors T31 and T32 may be connected in series, and may correspond collectively to the inverter 13 of FIG. 1A. In some embodiments, the transistors T11, T12, T13, T14, T21, T22, T23, T24, T31, and T32 of FIG. 1B may include metal-oxide-semiconductor (MOS) field-effect transistors.

The integrated circuit including the latch 10' of FIG. 1B may be realized via a semiconductor process, and a layout of the integrated circuit, corresponding to the latch 10', may include a cross-couple construct. A cross-couple construct may refer to a construct in which transistors having gates connected to the same node are formed by two adjacent gate lines or gate lines having at least one gate line therebetween, rather than by an integrated gate line, in the layout of the integrated circuit. For example, in the latch 10' of FIG. 1B, the transistor T12 (which may be a PMOS transistor) and the transistor T23 (which may be an NMOS transistor) may each have a gate to which the first input signal A is applied. The transistor T22 (which may be a PMOS transistor) and the transistor T13 (which may be an NMOS transistor) may each have a gate to which the second input signal B is applied. The transistors T12, T23, T22, and T13 may form a cross-couple construct XC in the layout of the integrated circuit including the latch 10'. As described herein, the transistors arranged and interconnected based on the cross-couple construct may be referred to as cross-coupled transistors, and the cross-couple construct may occur in various logic circuits, such as layouts, such as latches, flip-flops, and multiplexers.

Cross-couple constructs according to the inventive concepts of the present disclosure, and the example embodiments of the inventive concepts provided herein, may provide not only improved speed, but also reduced power consumption, by removing a parasitic capacitance. Also, routing congestion may be decreased due to simplified patterns for routing of cross-couple constructs, so that design freedom of the integrated circuit may be increased. As a result, performance of integrated circuits and semiconductor devices including the integrated circuits may be improved. Hereinafter, for convenience of explanation, example embodiments of the inventive concepts will be described mainly based on the cross-couple construct XC of FIG. 1B, wherein the cross-couple construct XC includes the transistors T12, T13, T22, and T23 having the gates to which the first input signal A or the second input signal B is applied. However, it will be understood that the present disclosure, the inventive concepts, and the example embodiments thereof are not limited to the cross-couple construct XC of FIG. 1B.

Figure 2A:
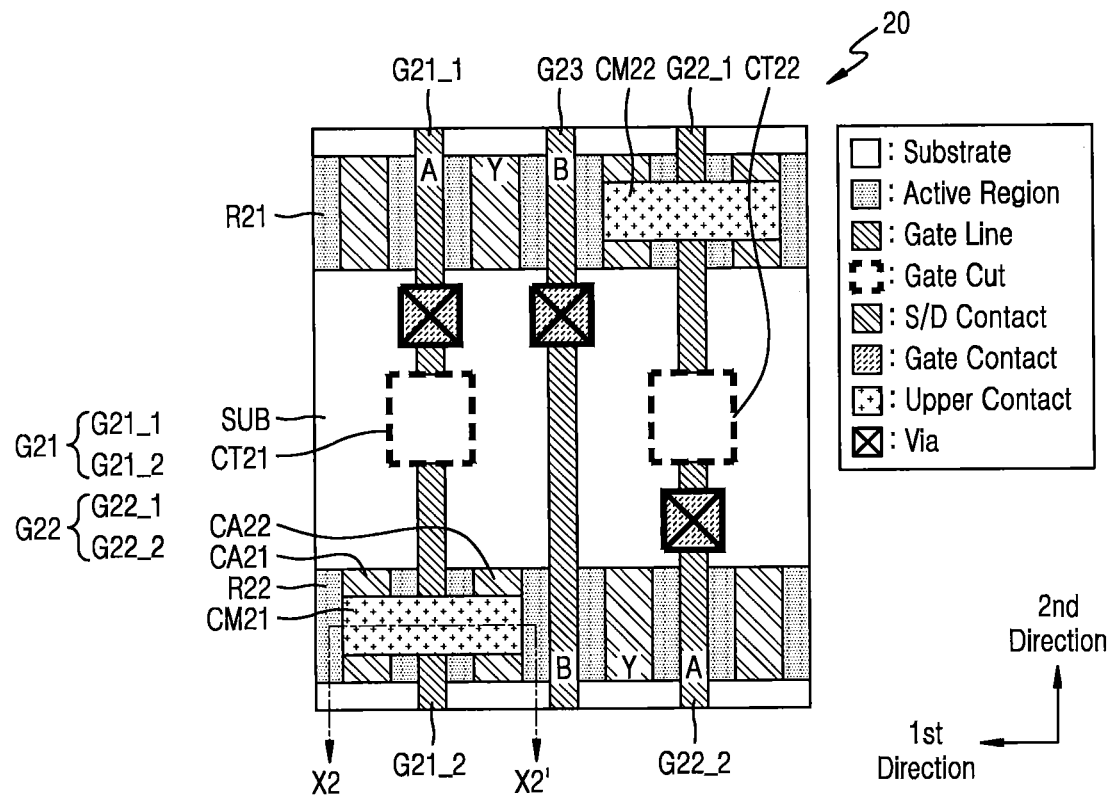
FIGS. 2A and 2B are a schematic plan view and a schematic cross-sectional view, respectively, of a layout of an integrated circuit.
Figure 2B:
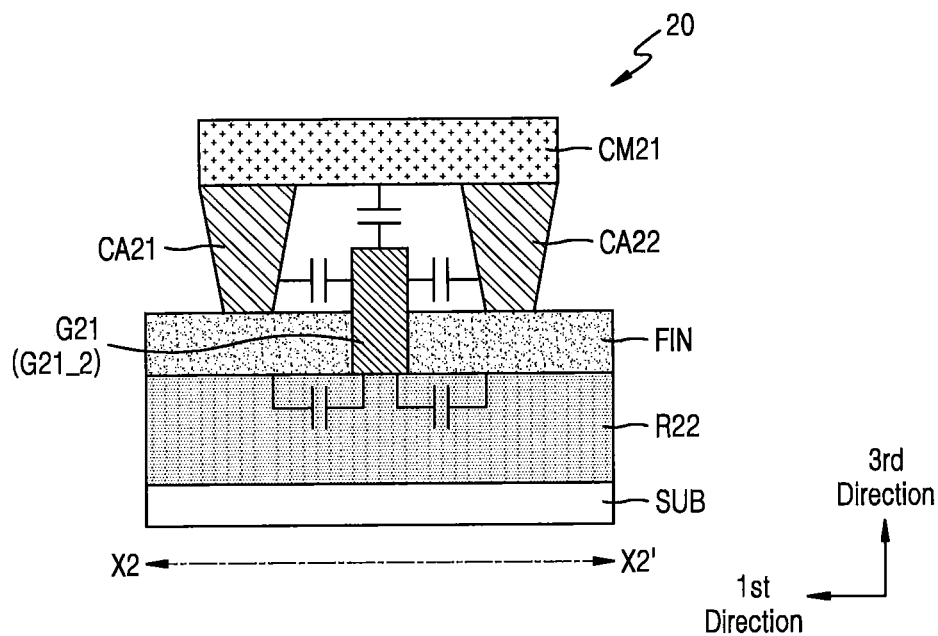

FIGS. 2A and 2B are respectively a plan view and a cross-sectional view schematically showing a layout of an integrated circuit 20 according to an example embodiment of the inventive concepts. Specifically, FIG. 2A is the plan view of the layout of the integrated circuit 20 including the cross-couple construct XC of FIG. 1B, and FIG. 2B is the cross-sectional view of an example section of the integrated circuit 20 of FIG. 2A, the section being taken along a line X2-X2'. Herein, a plane including a first direction and a second direction may be referred to as a horizontal surface, and a third direction may be perpendicular to the first direction and to the second direction (and hence, perpendicular to the plane or horizontal surface); a component arranged relatively in the third direction compared with other components may be referred to as being above the other components; and a component arranged relatively in a direction that is the opposite to the third direction compared with other components may be referred to as being below the other components. Also, among the surfaces of a component, a surface in the third direction may be referred to as a top surface of the component, a surface in the direction that is the opposite to the third direction may be referred to as a bottom surface of the component, and a surface in the first direction or the second direction may be referred to as a side surface of the component. Also, attention is drawn to the fact that in the drawings of the present disclosure, showing layouts of integrated circuits, vias may be illustrated regardless of patterns above the vias, for convenience of illustration. Hereinafter, FIGS. 2A and 2B will be described with reference to FIG. 1B.

Referring to FIG. 2A, the integrated circuit 20 may include a first active region R21 and a second active region R22, each extending in a first direction (or a first horizontal direction) in parallel to each other. The integrated circuit 20 may include a first gate line G21, a second gate line G22, and a third gate line G23, each extending in a second direction (or a second horizontal direction) in parallel to one another. In some embodiments, the first and second active regions R21 and R22 may include a semiconductor, such as silicon (Si) or germanium (Ge), a compound semiconductor, such as silicon-germanium (SiGe), silicon carbide (SiC), gallium arsenide (GaAs), indium arsenide (InAs), or indium phosphide (InP), or a conductive region, for example, a well or a structure doped with impurities. The first through third gate lines G21, G22, and G23 may include a work-function metal-containing layer and a gap-fill metal layer. For example, the work-function metal-containing layer may include at least one metal from among titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap-fill metal layer may include a W layer or an aluminium (Al) layer. In some embodiments, the first through third gate lines G21 through G23 may include a TiAlC/TiN/W stack, a TiN/TaN/TiAlC/TiN/W stack, or a TiN/TaN/TiN/TiAlC/TiN/W stack.

The first through third gate lines G21, G22, and G23 may form transistors in locations where the first through third gate lines G21, G22, and G23 overlap the first and second active regions R21 and R22 in a third direction, that is, a direction (or a vertical direction) perpendicular to the first and second directions. For example, the first gate line G21 may form the PMOS transistor T12 of FIG. 1B with the first active region R21, the second gate line G22 may form the NMOS transistor T23 of FIG. 1B with the second active region R22, and the third gate line G23 may form the PMOS transistor T22 and the NMOS transistor T13 of FIG. 1B with the first active region R21 and the second active region R22, respectively. In some embodiments, the transistors formed by the first through third gate lines G21, G22, and G23 may be fin field-effect transistors (FinFETs).

The first gate line G21 may form the transistor T12 with the first active region R21, while a portion of the first gate line G21, the portion including a region vertically overlapping the second active region R22, may be referred to as a dummy portion. Similarly, the second gate line G22 may form the transistor T23 with the second active region R22, while a portion of the second gate line G22, the portion including a region overlapping the first active region R21, may be referred to as a dummy portion. As will be described below, the dummy portions of the gate lines may increase a parasitic capacitance of the gate lines, thereby degrading an operation speed and power consumption of an integrated circuit.

In some embodiments, the gate lines may be divided into a dummy portion and a portion for forming transistors, wherein the dummy portion and the portion for forming the transistors may be insulated from each other. For example, as illustrated in FIG. 2A, the first gate line G21 may include a first partial gate line G21_1 and a first dummy gate line G21_2 separated from each other by a first cutting region (cutting region may be also referred to as gate cut) CT21, while the second gate line G22 may include a second dummy gate line G22_1 and a second partial gate line G22_2 separated from each other by a second cutting region CT22. Accordingly, each of the first and second partial gate lines G21_1 and G22_2 may have an end on a region between the first and second active regions R21 and R22, and the first input signal A applied to the first and second partial gate lines G21_1 and G22_2 may not be affected by a capacitance due to the dummy portions of the first and second gate lines G21 and G22.

In some embodiments, the cross-couple construct in the integrated circuit 20 may include a jumper (or a jumper structure, a jumper interconnection). For example, as illustrated in FIG. 2A, the integrated circuit 20 may include a first jumper electrically connecting source/drain regions formed on the second active region R22 at both sides of the first gate line G21, respectively. As will be described below with reference to FIG. 2B, the first jumper in the example of FIG. 2A may include source/drain contacts CA21 and CA22 respectively having bottom surfaces connected to the source/drain regions formed at both sides of the first gate line G21, and an upper contact CM21 extending in the first direction and having a bottom surface connected to the source/drain contacts CA21 and CA22. Similarly, the integrated circuit 20 may include a second jumper electrically connecting source/drain regions formed on the first active region R21 at both sides of the second gate line G22, respectively. The second jumper may include an upper contact CM22 extending in the first direction. The first and second jumpers may incapacitate unnecessary transistors by electrically connecting the source/drain regions formed at both sides of the dummy portions of the gate lines, and may increase a routing freedom by moving a location of a node corresponding to the source/drain regions to an edge of a layout portion corresponding to the cross-couple construct. In some embodiments, unlike the illustration of FIG. 2A, the layout including the cross-couple construct may include only one jumper.

Referring to FIG. 2B, the second active region R22 may be arranged on a substrate SUB, the first gate line G21 may be arranged on the second active region R22, and a fin FIN may be arranged on the second active region R22. As described above with reference to FIG. 2A, the first jumper may include the source/drain contacts CA21 and CA22 and the upper contact CM21, so as to electrically connect the source/drain regions formed on the second active region R22 at both sides of the first gate line G21. Accordingly, as illustrated in FIG. 2B, the first gate line G21 may have a parasitic capacitance via the second active region R22, a parasitic capacitance with respect to the source/drain contacts CA21 and CA22, and a parasitic capacitance with the upper contact CM21. The parasitic capacitances may increase current consumption caused by a signal applied to the first gate line G21, that is, the first input signal A, and may also deteriorate a response characteristic (for example, a rising time, a falling time, etc.) of the first input signal A. As described above with reference to FIG. 2A, since the first dummy gate line G21_2 including the dummy portion causing the parasitic capacitance may be separated from the first partial gate line G21_1 for forming the gate of the transistor, to which the first input signal A is applied, the parasitic capacitances illustrated in FIG. 2B may not affect the first input signal A. In the drawings hereinafter, fins on the active region are not illustrated, for convenience of illustration. However, it will be understood that the inventive concepts of the present disclosure, and the example embodiments of the inventive concepts, may be applied not only to an integrated circuit including a flat-type transistor, but also to an integrated circuit including a finFET.

Figure 3A:
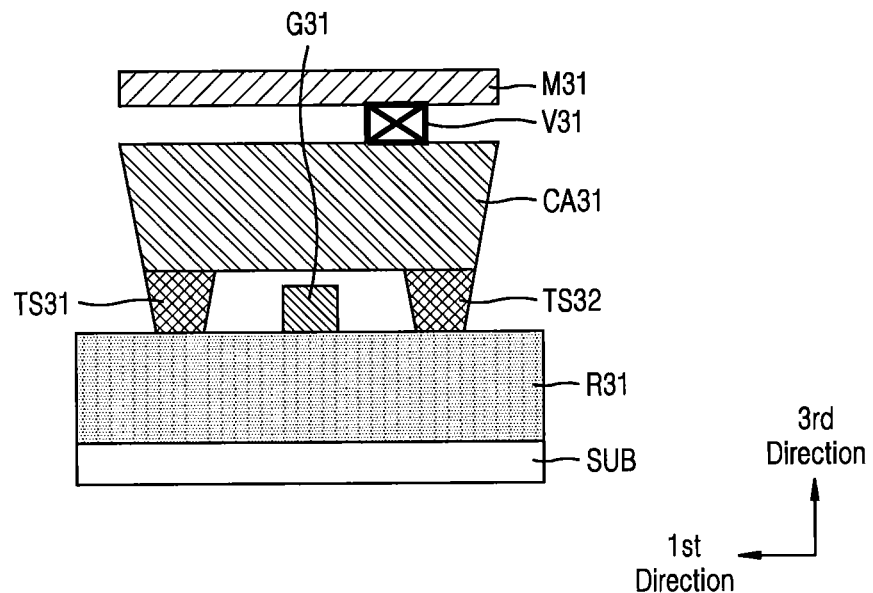
FIGS. 3A through 3E are cross-sectional views showing various examples of jumpers.
Figure 3B:
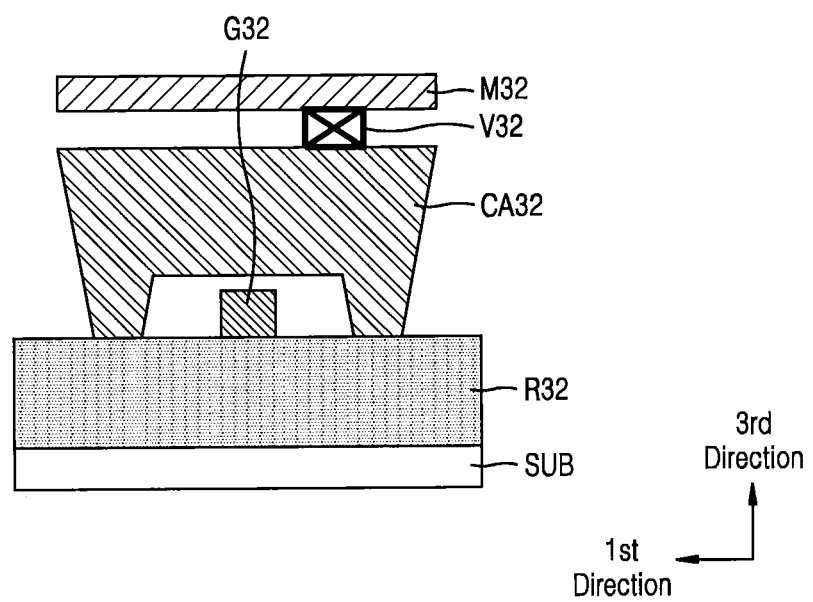
Figure 3C:
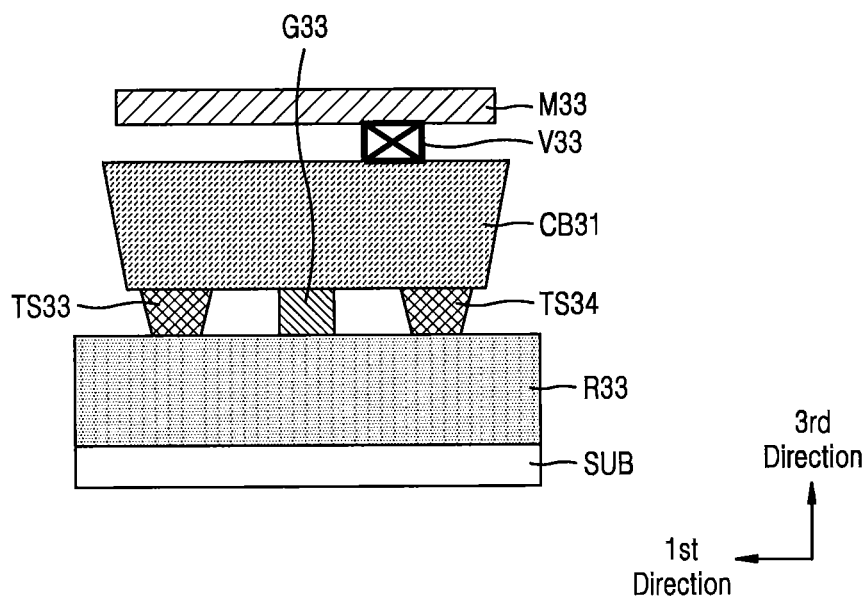
Figure 3D:
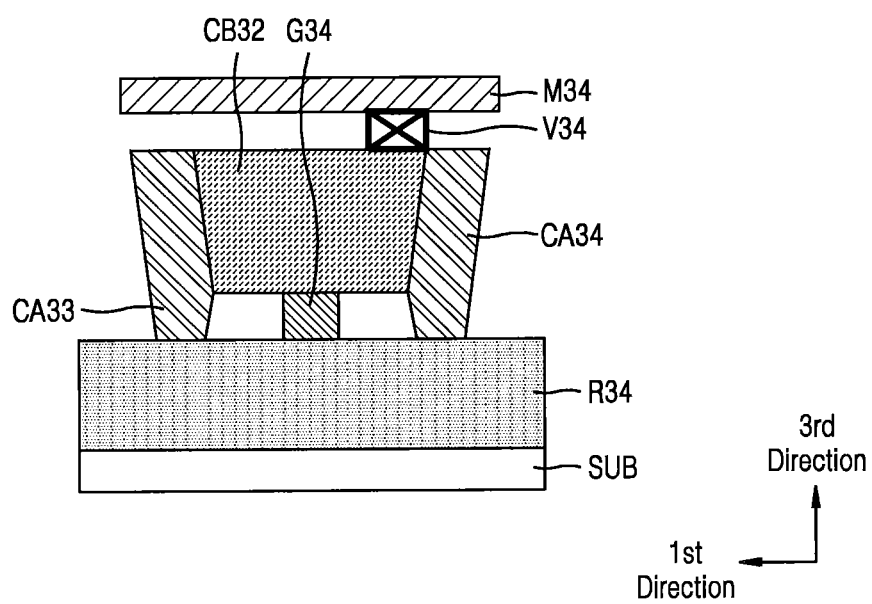
Figure 3E:
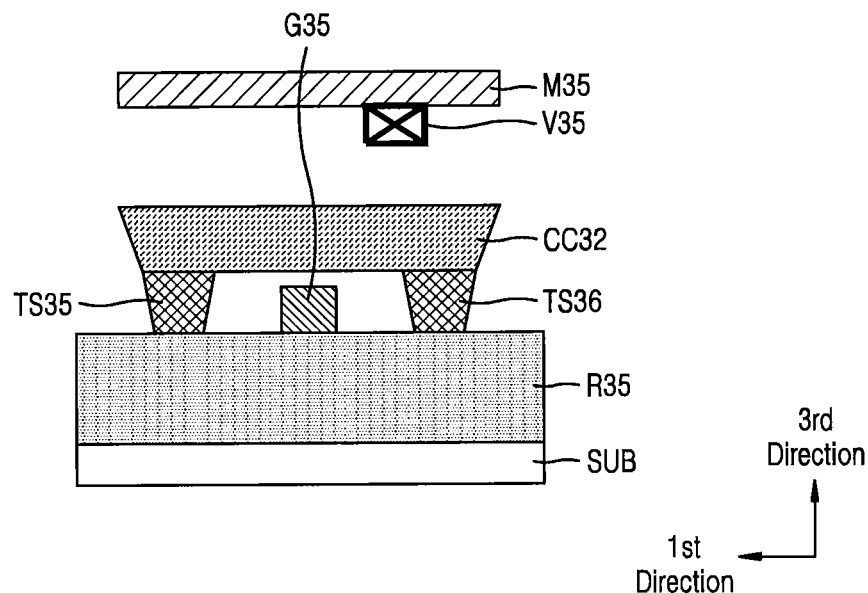

FIGS. 3A through 3E are cross-sectional views of jumpers, according to example embodiments. Specifically, FIGS. 3A through 3E are cross-sectional views showing sections of the jumpers, the sections being taken in a third direction. The jumpers are configured to electrically connect source/drain regions formed on active regions R31 through R35 at both sides of dummy portions of gate lines G31 through G35. Active region R31 and gate line G31 are shown in FIG. 3A, active region R32 and gate line G32 are shown in FIG. 3B, active region R33 and gate line G33 are shown in FIG. 3C, active region R34 and gate line G34 are shown in FIG. 3D, and active region R35 and gate line G35 are shown in FIG. 3E. As illustrated in FIGS. 3A through 3E, the jumpers may be configured to electrically connect the source/drain regions formed on the active regions R31 through R35 at both sides of the gate lines G31 through G35, wherein the active regions R31 through R35 are arranged on a substrate SUB.

Referring to FIG. 3A, in some embodiments, the jumper may include lower contacts TS31 and TS32 and a source/drain contact CA31. Each of the lower contacts TS31 and TS32 may have a bottom surface connected to the active region R31 and a height (a length in the third direction), which is greater than a height of the gate line G31. The source/drain contact CA31 may cross the gate line G31 and extend in a first direction, may have a bottom surface connected to the lower contacts TS31 and TS32 and a top surface connected to a via V31 contacting a metal pattern M31, and may be spaced apart from the gate line G31 to be insulated from the gate line G31.

Referring to FIG. 3B, in some embodiments, the jumper may include a source/drain contact CA32 connected to the active region R32 and extending in the first direction. For example, as illustrated in FIG. 3B, the source/drain contact CA32 may have a bottom surface connected to the active region R32 and a top surface connected to a via V32 contacting a metal pattern M32, and may cross the gate line G32 and extend in the first direction. In some embodiments, after the gate line G32 is formed, an insulating material may be deposited on a top surface and side surfaces of the gate line G32, and then, the source/drain contact CA32 may be formed. Similarly to the source/drain contact CA31 of FIG. 3A, the source/drain contact CA32 of FIG. 3B may be spaced apart from the gate line G32 to be insulated from the gate line G32.

Referring to FIG. 3C, in some embodiments, the jumper may include lower contacts TS33 and TS34 and a gate contact CB31. Each of the lower contacts TS33 and TS34 may have a bottom surface connected to the active region R33 and a height (a length in the third direction), which is the same as a height of the gate line G33. The gate contact CB31 may cross the gate line G33 and extend in the first direction and may have a bottom surface connected to the lower contacts TS33 and TS34 and a top surface connected to a via V33 contacting a metal pattern M33. Also, the gate contact CB31 may have the bottom surface connected to the gate line G33 to be electrically connected to the gate line G33.

Referring to FIG. 3D, in some embodiments, the jumper may include source/drain contacts CA33 and CA34 and a gate contact CB32. For example, as illustrated in FIG. 3D, each of the source/drain contacts CA33 and CA34 may have a bottom surface connected to the active region R34, and a side surface including at least a portion connected to the gate contact CB32. The gate contact CB32 may have a top surface connected to a via V34 contacting a metal pattern M34, and may have a bottom surface connected to the gate line G34 to be electrically connected to the gate line G34. As will be described below with reference to FIGS. 9A and 9B, the jumper (for example, the jumper of FIG. 3C or 3D) electrically connected to the gate line may be implemented to use the gate line as a portion of an interconnection. The interconnection, which may be a structure configured to electrically connect at least two patterns corresponding to the same node, may refer to a structure, such as a contact, a via, a pattern on a wiring layer, etc., which includes at least one conductive pattern in an integrated circuit.

Referring to FIG. 3E, in some embodiments, the jumper may include lower contacts TS35 and TS36 and a middle contact CC32. Each of the lower contacts TS35 and TS36 may have a bottom surface connected to the active region R35 and a height, which is greater than a height of a gate line G35. The middle contact CC32 may cross the gate line G35, may extend in the first direction, may have a bottom surface connected to the lower contacts TS35 and TS36, and may be spaced apart from the gate line G35 to be insulated from the gate line G35. Compared with the example of FIG. 3A, the middle contact CC32 may be spaced apart from a via V35 contacting a metal pattern M35 in the third direction. That is, a top surface of the middle contact CC32 may not extend to the via V35. In FIG. 3E, the via V35 is illustrated to describe that the top surface of the middle contact CC32 is apart from a surface in which the via V35 is formed. The structures of the jumpers described above with reference to FIGS. 2A, 2B, and 3A through 3E are only examples. It will be understood that jumpers having different structures from the jumpers illustrated in FIGS. 2A, 2B, and 3A through 3E may be implemented in cross-couple constructs in accordance with the inventive concepts of the present disclosure. Hereinafter, the example embodiments will be described mainly based on the jumpers of FIGS. 2B and 3D. However, the present disclosure example embodiments are not limited thereto.

Figure 4A:
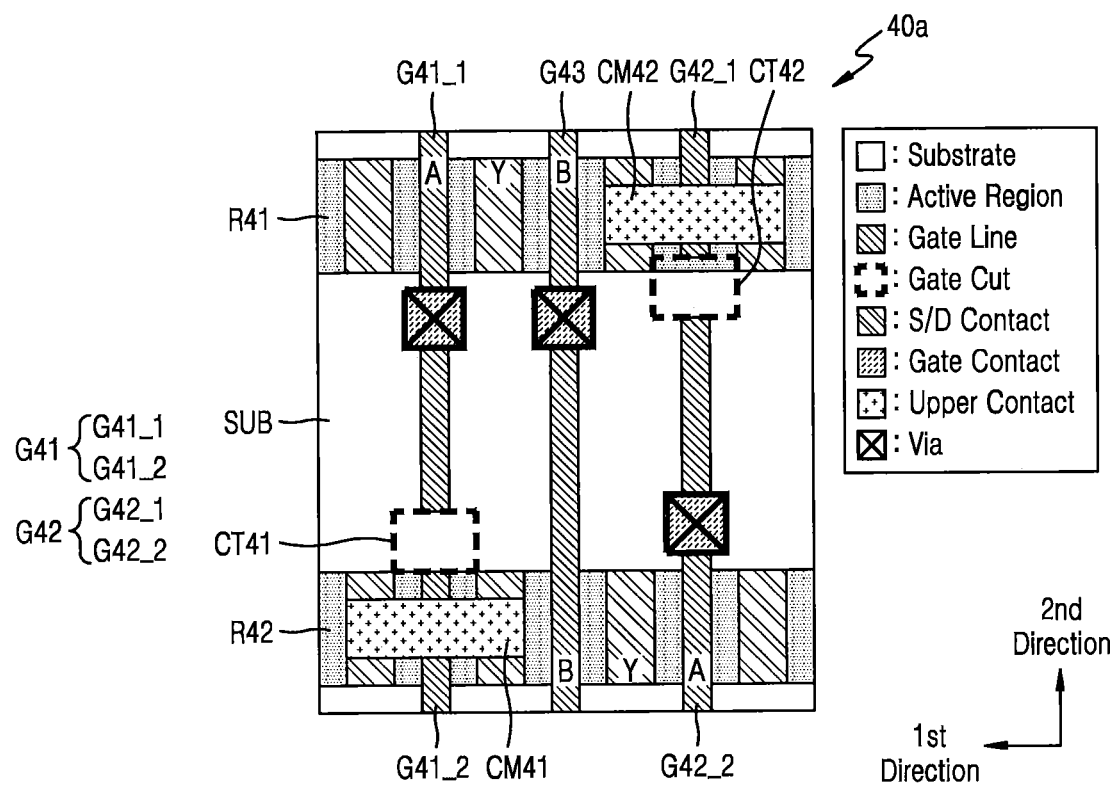
FIGS. 4A through 4C are schematic plan views of layouts of integrated circuits.
Figure 4B:
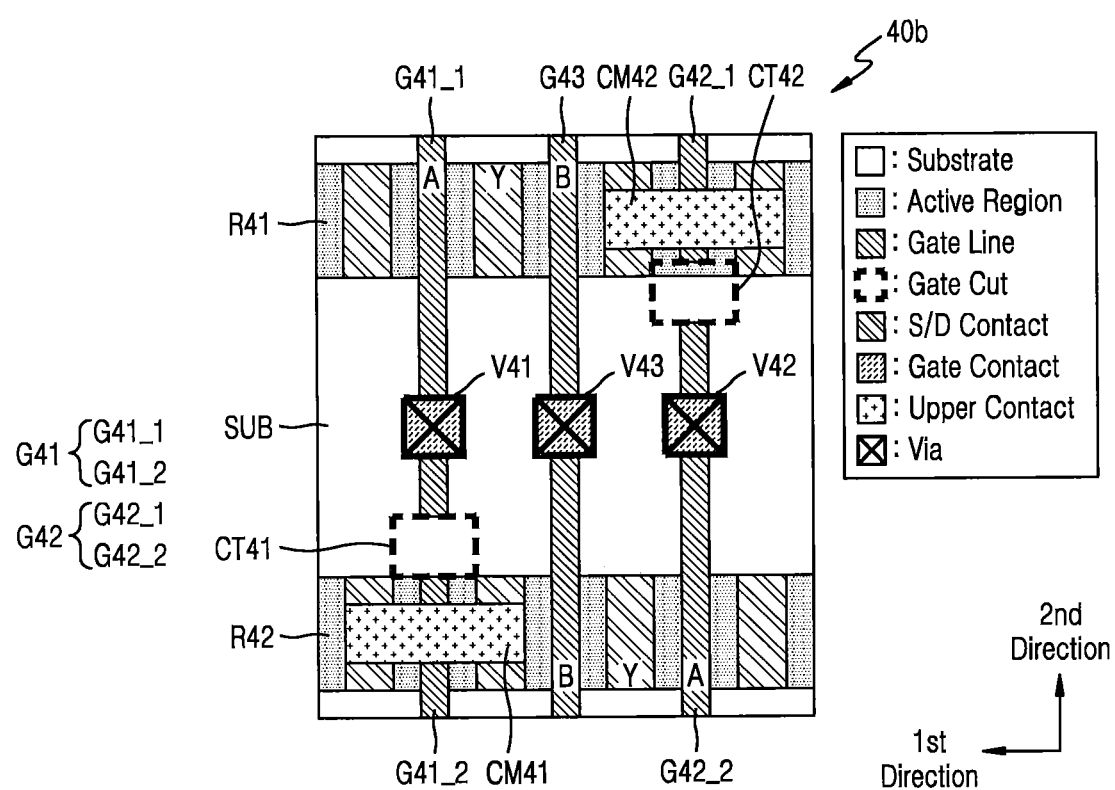
Figure 4C:
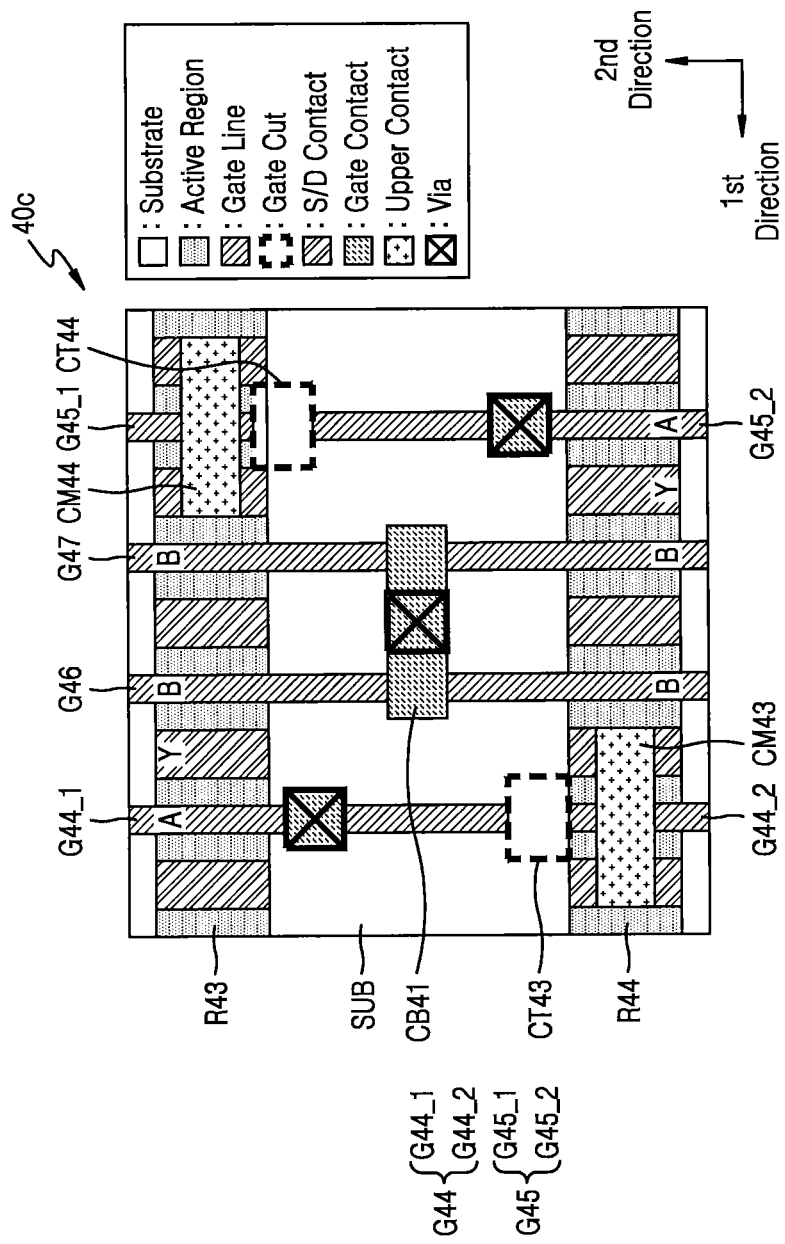

FIGS. 4A through 4C are schematic plan views of layouts of integrated circuits 40a, 40b, and 40c, respectively, according to example embodiments. Specifically, compared with the integrated circuit 20 of FIG. 2A, the integrated circuit 40a of FIG. 4A indicates an example of an available location of cutting regions for cutting gate lines, the integrated circuit 40b of FIG. 4B indicates an example of an available location of vias, and the integrated circuit 40c of FIG. 4C indicates an example of an integrated circuit including four gate lines. As described above with reference to FIG. 2A, a first gate line G41 and a second gate line G42 of FIGS. 4A and 4B may be cut by a first cutting region CT41 and a second cutting region CT42, respectively, and a fourth gate line G44 and a fifth gate line G45 of FIG. 4C may be cut by a third cutting region CT43 and a fourth cutting region CT44, respectively. Hereinafter, aspects of the inventive concepts are described with reference to FIGS. 4A through 4C. Some aspects described elsewhere herein may not be repeatedly described.

Referring to FIG. 4A, the integrated circuit 40a may include a first active region R41 and a second active region R42, each extending in a first direction in parallel to each other. The integrated circuit 40a may include the first gate line G41, the second gate line G42, and a third gate line G43, each extending in a second direction in parallel to one another. The first gate line G41 may include a first partial gate line G41_1 and a first dummy gate line G41_2 separated from each other by the first cutting region CT41, wherein a first input signal A may be applied to the first partial gate line G41_1. The second gate line G42 may include a second dummy gate line G42_1 and a second partial gate line G42_2 separated from each other by the second cutting region CT42, wherein the first input signal A may be applied to the second partial gate line G42_2. The third gate line G43 may form a transistor with each of the first and second active regions R41 and R42, and a second input signal B may be applied to the third gate line G43. Also, the integrated circuit 40a may include a first jumper including an upper contact CM41 crossing the first dummy gate line G41_2 in the first direction and a second jumper including an upper contact CM42 crossing the second dummy gate line G42_1 in the first direction.

The first and second cutting regions CT41 and CT42 may be arranged such that the first and second partial gate lines G41_1 and G42_2, to which the first input signal A is applied, may have ends on a region between the first active region R41 and the second active region R42. In some embodiments, the first cutting region CT41 may cut the first gate line G41 such that the first partial gate line G41_1 may have the end on the region between the first and second active regions R41 and R42 and the first dummy gate line G41_2 may have an end at an edge of the second active region R42. Stated differently, side surfaces of the first dummy gate line G41_2 and the second active region R42 that face toward the first active region R41 may be aligned. In some embodiments, the second cutting region CT42 may cut the second gate line G42 such that the second partial gate line G42_2 may have the end on the region between the first and second active regions R41 and R42 and the second dummy gate line G42_1 may have an end on the first active region R41. Stated differently, side surfaces of the second dummy gate line G42_1 and the first active region R41 that face toward the second active region R42 may not be aligned.

Referring to FIG. 4B, gate contacts and vias connected to the gate lines may be arranged in the first direction. For example, as illustrated in FIG. 4B, in the integrated circuit 40b, a first via V41 electrically connected to the first partial gate line G41_1, a second via V42 electrically connected to the second partial gate line G42_2, and a third via V43 electrically connected to the third gate line G43 may be arranged in the first direction. Stated differently, the first via V41, second via V42, and third via V43 may be an equal distance from the first active region R41 and/or second active region R42, when viewed in a plan view.

Referring to FIG. 4C, the integrated circuit 40c may include a third active region R43 and a fourth active region R44, each extending in the first direction in parallel to each other. The integrated circuit 40c may include fourth, fifth, sixth, and seventh gate lines G44, G45, G46, and G47, respectively, each extending in the second direction and parallel to one another. The fourth gate line. G44 may include a third partial gate line G44_1 and a first dummy gate line G44_2 separated from each other by the third cutting region CT43, wherein a first input signal A may be applied to the third partial gate line G44_1. The fifth gate line G45 may include a second dummy gate line G45_1 and a fourth partial gate line G45_2 separated from each other by the fourth cutting region CT44, wherein the first input signal A may be applied to the fourth partial gate line G45_2. The sixth and seventh gate lines G46 and G47 may extend in the second direction between the fourth and fifth gate lines G44 and G45 and may form transistors with each of the third and fourth active regions R43 and R44, and a second input signal B may be applied to the sixth and seventh gate lines G46 and G47. The sixth and seventh gate lines G46 and G47 may be electrically connected to each other via a gate contact CB41. Also, the integrated circuit 40c may include a first jumper including an upper contact CM43 crossing the first dummy gate line G44_2 in the first direction and a second jumper including an upper contact CM44 crossing the second dummy gate line G45_1 in the first direction.

Compared with the integrated circuits 40a and 40b of FIGS. 4A and 4B, the integrated circuit 40c of FIG. 4C may include the two parallel gate lines, namely, the sixth and seventh gate lines G46 and G47, to which the second input signal B is applied. Accordingly, a space for routing may be obtained between the fourth gate line G44 and the fifth gate line G45. Moreover transistors to which the second input signal B is applied may have increased gate strengths. For example, compared with a transistor formed by the first active region R41 and the third gate line G43 in the integrated circuit 40a of FIG. 4A, transistors formed by the third active region R43 and each of the sixth and seventh gate lines G46 and G47 in the integrated circuit 40c of FIG. 4C may provide approximately twice the gate strength.

Figure 5A:
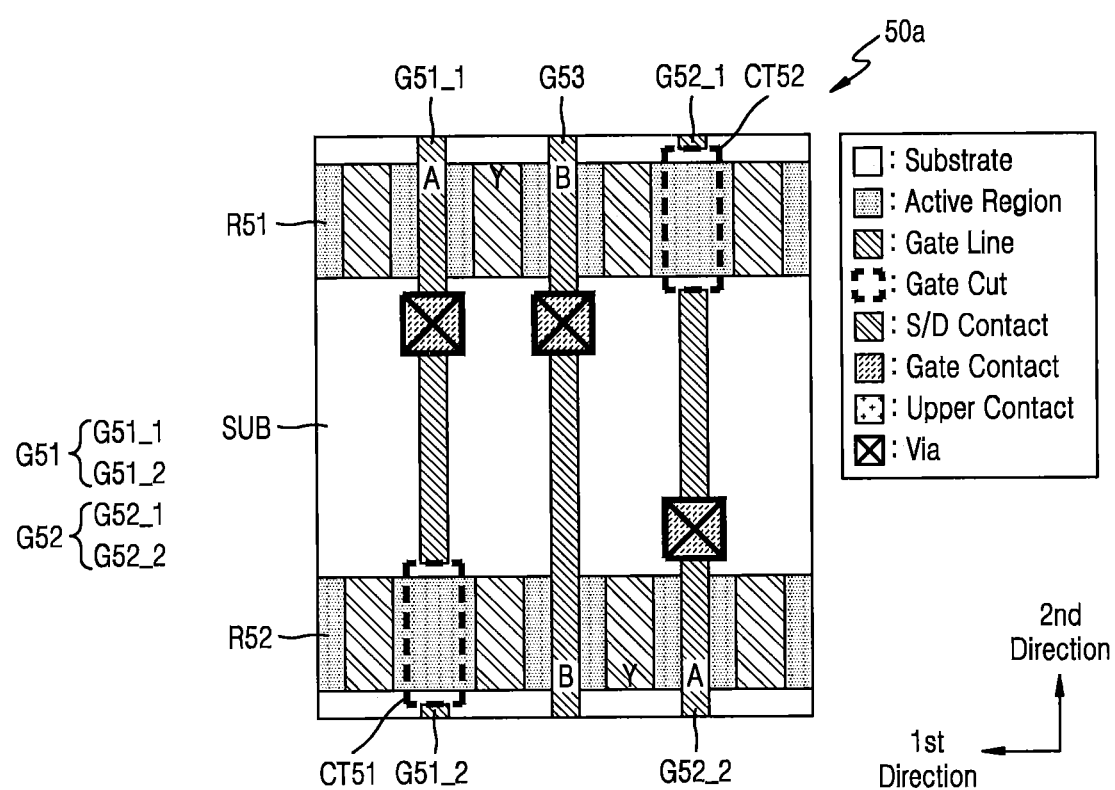
FIGS. 5A and 5B are schematic plan views of layouts of integrated circuits.
Figure 5B:
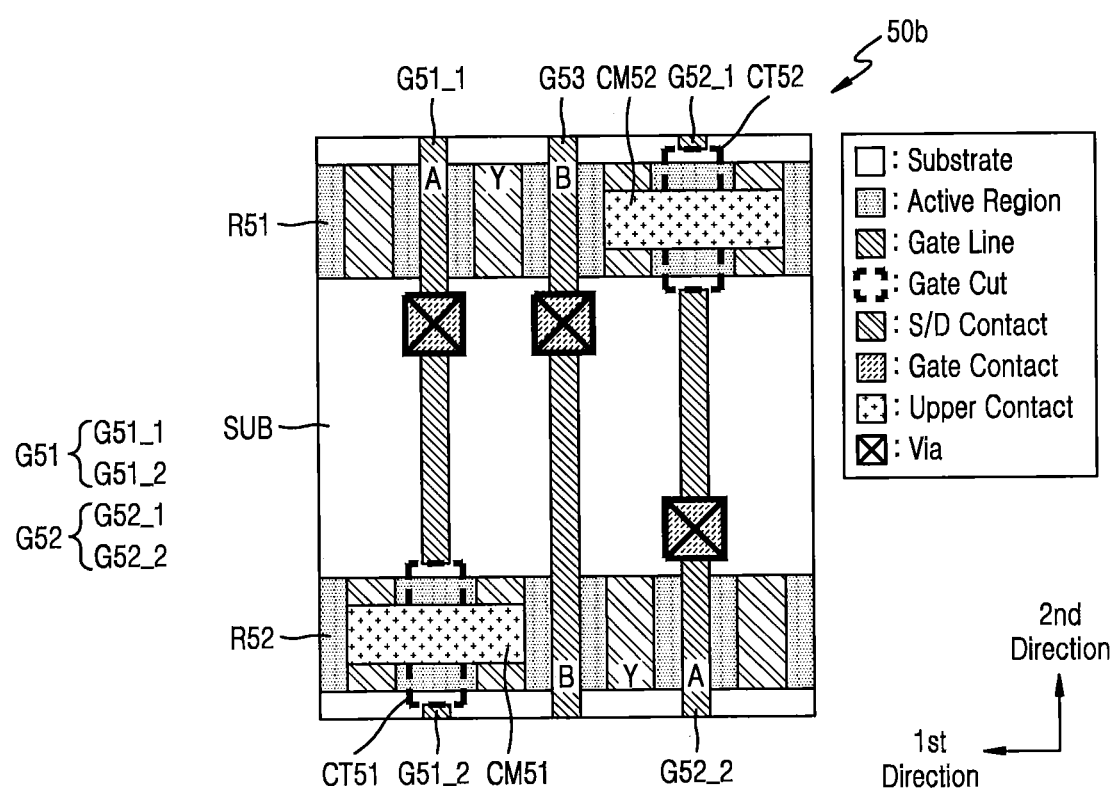

FIGS. 5A and 5B are schematic plan views of layouts of integrated circuits 50a and 50b, respectively, according to example embodiments. Specifically, compared with the integrated circuit 40a of FIG. 4A, in the case of the integrated circuits 50a and 50b of FIGS. 5A and 5B, a dummy portion may be removed from first and second gate lines G51 and G52 of the integrated circuits 50a and 50b of FIGS. 5A and 5B. Similar to the integrated circuit 40a described with reference to FIG. 4A, the first and second gate lines G51 and G52 of FIGS. 5A and 5B may be cut by first and second cutting regions CT51 and CT52, respectively. Hereinafter, some aspects of the inventive concepts are described with reference to FIGS. 5A and 5B, and some aspects described elsewhere herein may not be repeatedly described.

Referring to FIG. 5A, the integrated circuit 50a may include first and second active regions R51 and R52, each extending in a first direction in parallel to each other. The integrated circuit 50a may include the first gate line G51, the second gate line G52, and a third gate line G53, each extending in a second direction and in parallel to one another. The first gate line G51 may include a first partial gate line G51_1 and a first dummy gate line G51_2 separated from each other by the first cutting region CT51, wherein a first input signal A may be applied to the first partial gate line G51_1. The second gate line G52 may include a second dummy gate line G52_1 and a second partial gate line G52_2 separated from each other by the second cutting region CT52, wherein the first input signal A may be applied to the second partial gate line G52_2. The third gate line G53 may form transistors with each of the first and second active regions R51 and R52, and a second input signal B may be applied to the third gate line G53.

In some embodiments, a portion of the first gate line G51 that includes a portion overlapping the second active region R52 in a perpendicular direction may be removed from the first gate line G51. Similarly, a portion of the second gate line G52 that includes a portion overlapping the first active region R51 in a perpendicular direction may be removed from the second gate line G52. Stated differently, the first gate line G51 may not overlap the second active region R52 after the portion of the first gate line G51 is removed, and/or the second gate line G52 may not overlap the first active region R51 after the portion of the second gate line G52 is removed. Accordingly, parasitic capacitances due to the dummy portions of the first and second gate lines G51 and G52 may be eliminated.

Referring to FIG. 5B, and similarly to the integrated circuit 50a of FIG. 5A, the integrated circuit 50b may include the first and second gate lines G51 and G52, portions of which are removed therefrom. The integrated circuit 50b may further include jumpers overlapping the removed portions of the first and second gate lines G51 and G52 in a perpendicular direction. For example, the integrated circuit 50b may include a first jumper crossing the first cutting region CT51 in the first direction and including a first upper contact CM51, and a second jumper crossing the second cutting region CT52 in the first direction and including a second upper contact CM52. Since the dummy portions of the first and second gate lines G51 and G52 are removed from the first and second gate lines G51 and G52, parasitic capacitances due to the first and second jumpers may not affect the first input signal A, as described above with reference to FIG. 2B.

Figure 6:
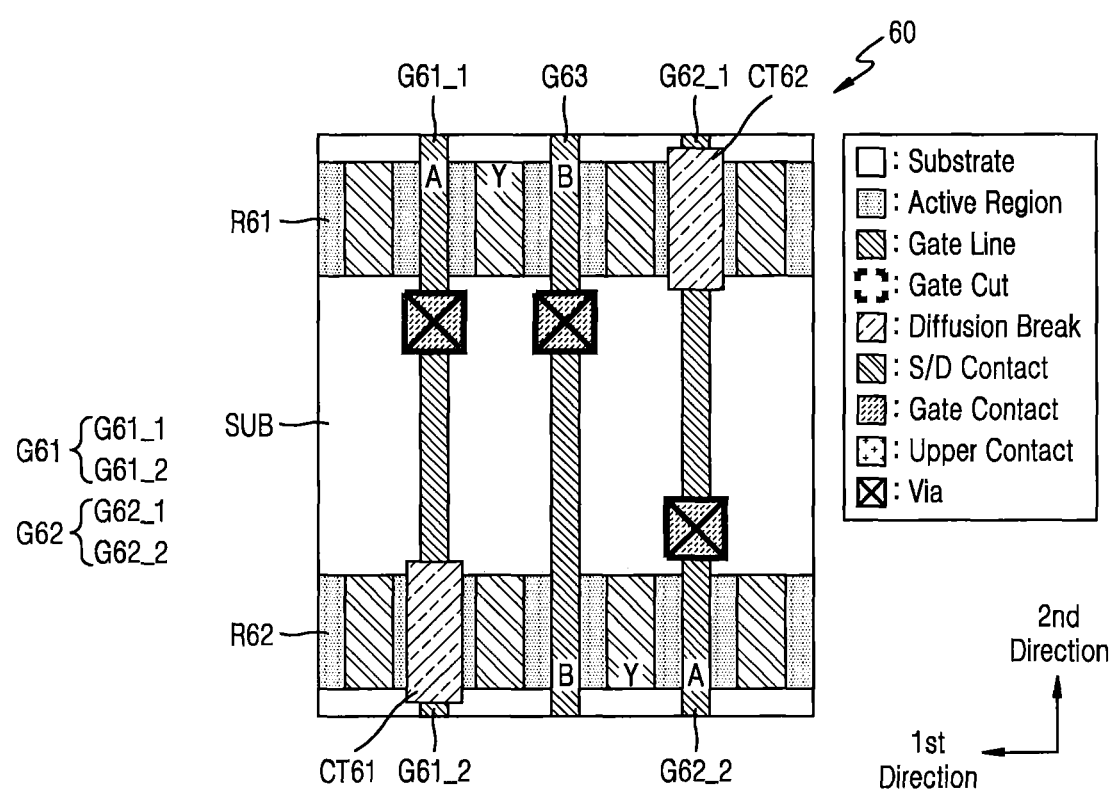
FIG. 6 is a schematic plan view of a layout of an integrated circuit.

FIG. 6 is a schematic plan view of a layout of an integrated circuit 60 according to an example embodiment. Specifically, compared with the integrated circuits 50a and 50b of FIGS. 5A and 5B, in the integrated circuit 60 of FIG. 6, first and second gate lines G61 and G62 may be cut by first and second cutting regions CT61 and CT62, respectively, wherein the first and second cutting regions CT61 and CT62 are filled with an insulating material.

Referring to FIG. 6, the integrated circuit 60 may include first and second active regions R61 and R62, each extending in a first direction in parallel to each other, and the integrated circuit 60 may include the first gate line G61, the second gate line G62, and a third gate line G63, each extending in a second direction in parallel to one another. The first gate line G61 may include a first partial gate line G61_1 and a first dummy gate line G61_2 separated from each other by the first cutting region CT61, wherein a first input signal A may be applied to the first partial gate line G61_1. The second gate line G62 may include a second dummy gate line G62_1 and a second partial gate line G62_2 separated from each other by the second cutting region CT62, wherein the first input signal A may be applied to the second partial gate line G62_2. The third gate line G63 may form transistors with each of the first and second active regions R61 and R62, and a second input signal B may be applied to the third gate line G63.

In some embodiments, the first and second cutting regions CT61 and CT62 may be filled with an insulating material. For example, the first cutting region CT61, as a diffusion break, may remove not only the first gate line G61, but also at least a portion of the second active region R62, and the removed regions may be filled with an insulating material. Accordingly, a dummy portion of the first gate line G61 may be removed by the diffusion break, and a dummy portion of the second gate line G62 may be removed by the diffusion break. Although not shown, in some embodiments, the integrated circuit 60 of FIG. 6 may further include jumpers crossing the diffusion break in the first direction, similar to the jumpers of integrated circuit 50b of FIG. 5B.

Figure 7:
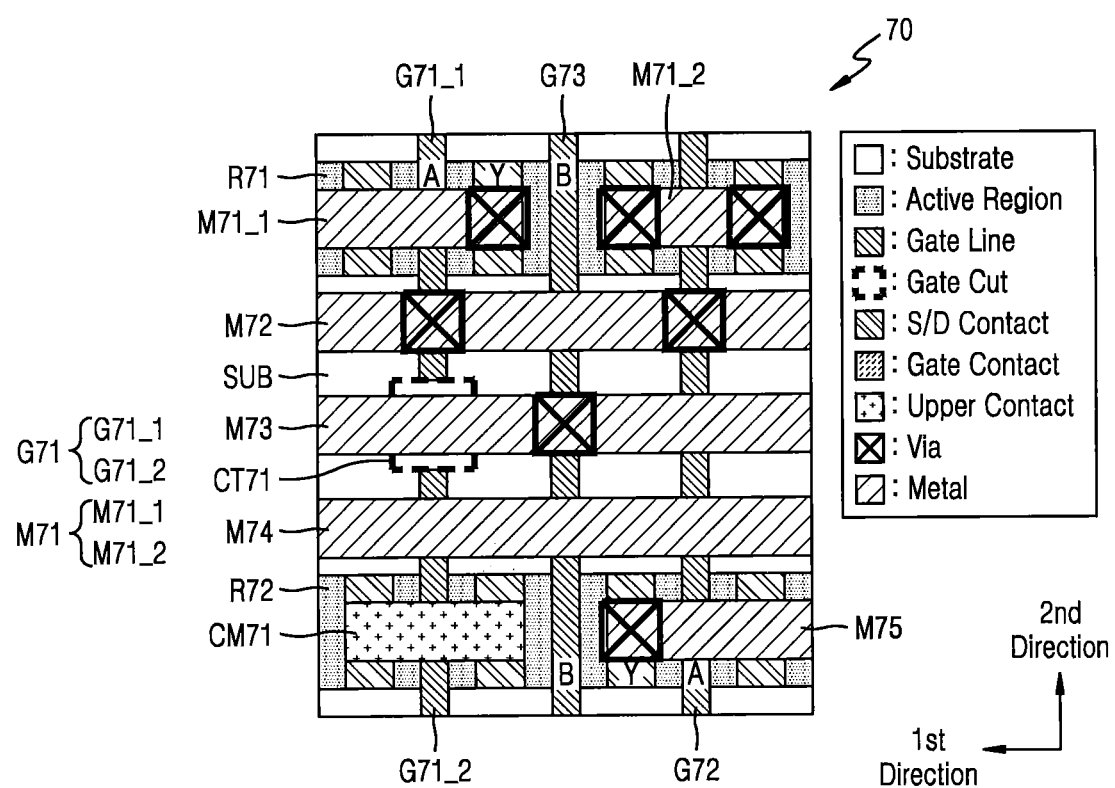
FIG. 7 is a schematic plan view of a layout of an integrated circuit.

FIG. 7 is a schematic plan view of a layout of an integrated circuit 70 according to an example embodiment. Specifically, compared with the integrated circuit 20 of FIG. 2A, in the layout of FIG. 7, a second gate line G72 may not be cut by a cutting region.

Referring to FIG. 7, the integrated circuit 70 may include first and second active regions R71 and R72, each extending in a first direction in parallel to each other, and the integrated circuit 70 may include a first gate line G71, the second gate line G72, and a third gate line G73, each extending in a second direction in parallel to one another. Also, the integrated circuit 70 may include first through fifth metal lines M71 through M75 extending on the first through third gate lines G71 through G73 in the first direction in parallel to one another. As illustrated in FIG. 7, the first metal line M71 may include first and second metal patterns M71_1 and M71_2 spaced apart from each other in the first direction. Herein, the metal lines and the metal patterns may refer to certain patterns formed on a wiring layer connected to the gate lines and/or the source/drain regions via the contacts and the vias, and may include a conductive material that is different from a metal.

The first gate line G71 may include a first partial gate line G71_1 and a first dummy gate line G71_2 separated from each other by a first cutting region CT71, wherein a first input signal A may be applied to the first partial gate line G71_1. Also, the integrated circuit 70 may include a first jumper that includes a first upper contact CM71 crossing the first dummy gate line G71_2 in the first direction. Based on the first cutting region CT71, the first input signal A applied to the first partial gate line G71_1 may not be affected by a parasitic capacitance generated due to the first upper contact CM71.

The second gate line G72 may continually extend in the second direction from the first active region R71 to the second active region R72, as illustrated in FIG. 7. Also, a second jumper configured to connect source/drain regions formed on the first active region R71 at both sides of the second gate line G72 may include the second metal pattern M71_2 crossing the second gate line G72 in the first direction. As described above with reference to FIG. 2B, while a contact extending in the first direction, for example, an upper gate contact or a source/drain contact may cause a relatively high parasitic capacitance, due to a less distance with respect to the gate line, a metal pattern above the contact and the via may cause a relatively low parasitic capacitance due to a great distance with respect to the gate line. Accordingly, in some embodiments, the second gate line G72 crossing the second jumper including the second metal pattern M71_2 may not be cut by a cutting region, and may continually extend in the second direction between the first and second active regions R71 and R72.

Figure 8A:
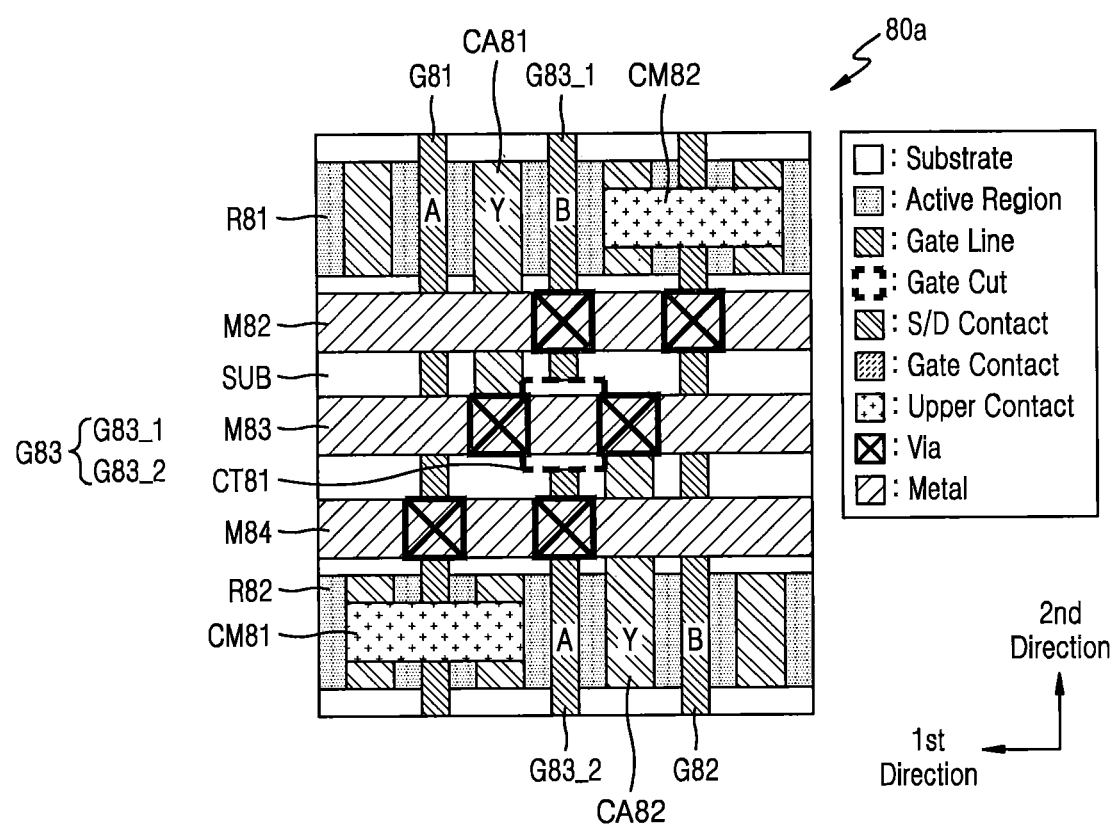
FIGS. 8A through 8C are schematic plan views of layouts of integrated circuits.
Figure 8B:
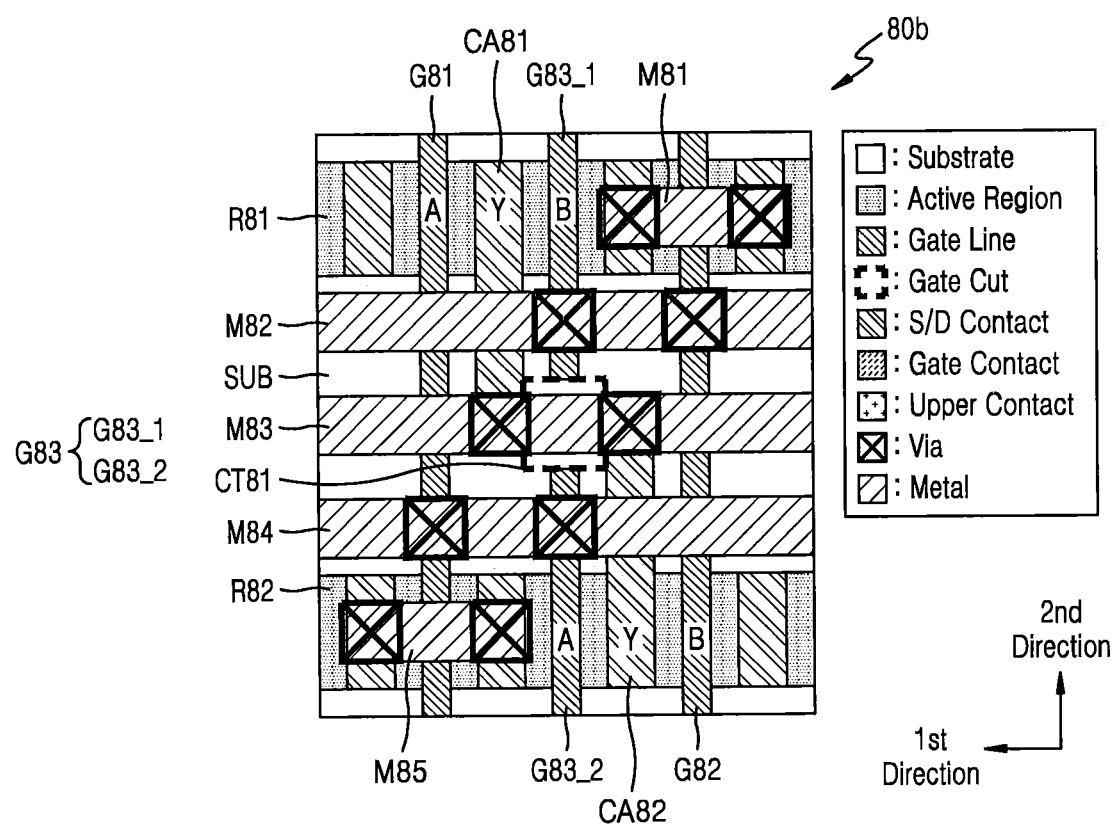
Figure 8C:
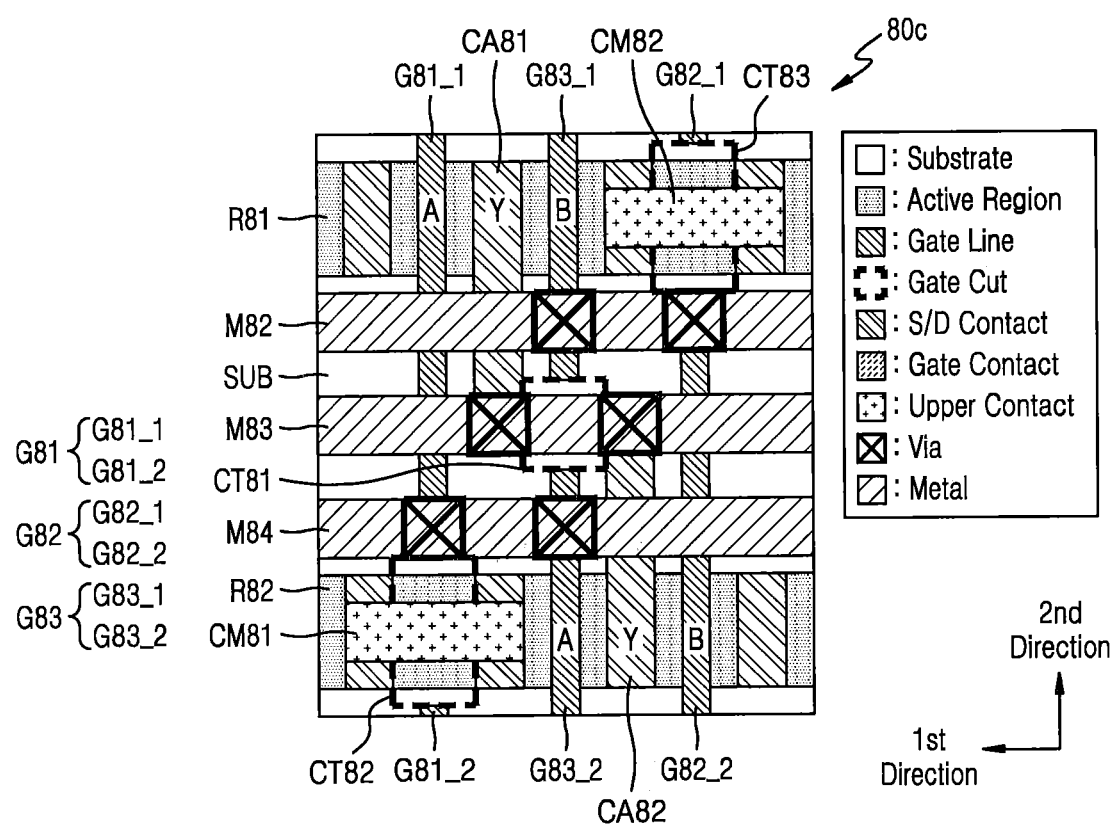

FIGS. 8A through 8C are schematic plan views of layouts of integrated circuits 80a, 80b, and 80c, respectively, according to example embodiments. Specifically, FIGS. 8A through 8C illustrate cross-couple constructs available in the layouts of the integrated circuits 80a, 80b, and 80c having decreased sizes. Compared with the layouts described above with reference to FIG. 2A, etc., in the integrated circuits 80a, 80b, and 80c of FIGS. 8A through 8C, a third gate line G83, which is arranged in the middle among first through third gate lines G81, G82, and G83, may include first and second partial gate lines G83_1 and G83_2, to which different signals, namely, first and second input signals A and B, may be applied, respectively. Hereinafter, some aspects of the inventive concepts are described with reference to FIGS. 8A through 8C, and some aspects described elsewhere herein will not be repeatedly described.

Referring to FIG. 8A, the integrated circuit 80a may include first and second active regions R81 and R82 extending in a first direction in parallel to each other, and may include the first through third gate lines G81, G82, and G83 extending in a second direction in parallel to one another. Also, the integrated circuit 80a may include second through fourth metal lines M82, M83, and M84 extending in the first direction in parallel to one another. As semiconductor processes have been miniaturized, a distance between the first and second active regions R81 and R82 may be reduced so that the number of metal lines that extend or that may extend in the first direction in parallel to one another, on a region between the first and second active regions R81 and R82, may be reduced. For example, the integrated circuit 80a of FIG. 8A may include three parallel metal lines, that is, the second through fourth metal lines M82, M83, and M84, between the first and second active regions R81 and R82. Due to a decrease in the number of metal lines, routing may not be easy, and a cross-couple construct for resolving routing congestion may be demanded. A structure including the decreased number of metal lines may be referred to as a low track construct and a standard cell including the decreased number of metal lines may be referred to as a low track standard cell. Although not shown in FIG. 8A, the integrated circuit 80a may further include a first metal line adjacent to the second metal line M82 and a fifth metal line adjacent to the fourth metal line M84.

The first and second gate lines G81 and G82 may continually extend in the second direction on a region between the first and second active regions R81 and R82, while the third gate line G83 may include the first and second partial gate lines G83_1 and G83_2 separated from each other by a first cutting region CT81. As illustrated in FIG. 8A, while the first input signal A may be applied to the first gate line G81 and the second partial gate line G83_2, the second input signal B may be applied to the second gate line G82 and the first partial gate line G83_1. Also, the integrated circuit 80a may include a first jumper including a first upper contact CM81 crossing the first gate line G81 in the first direction and a second jumper including a second upper contact CM82 crossing the second gate line G82 in the first direction.

In some embodiments, for routing an internal signal Y, gate contacts extending in the second direction may be used. For example, as illustrated in FIG. 8A, the integrated circuit 80a may include a first source/drain contact CA81 having a bottom surface connected to a source/drain region, and extending in the second direction, wherein the source/drain region is shared by transistors formed by each of the first gate line G81 and the first partial gate line G83_1 with the first active region R81. Also, the integrated circuit 80a may include a second source/drain contact CA82 having a bottom surface connected to a source/drain region, and extending in the second direction, wherein the source/drain region is shared by transistors formed by each of the second gate line G82 and the second partial gate line G83_2 with the second active region R82. The first and second source/drain contacts CA81 and CA82 may extend in the first direction such that the first and second source/drain contacts CA81 and CA82 overlap each other. The first and second source/drain contacts CA81 and CA82 may be electrically connected to each other by the third metal line M83 extending in the first direction. Also, the first gate line G81 and the second partial gate line G83_2, to which the first input signal A is applied, may be electrically connected to each other by the fourth metal line M84, and the second gate line G82 and the first partial gate line G83_1, to which the second input signal B is applied, may be electrically connected to each other by the second metal line M82.

Referring to FIG. 8B, the integrated circuit 80b may include a jumper including a metal pattern. For example, as illustrated in FIG. 8B, the integrated circuit 80b may include a first jumper including the fifth metal line M85 crossing the first gate line G81 in the first direction, and a second jumper including the first metal line M81 crossing the second gate line G82 in the first direction. As described above with reference to FIG. 7, due to a distance between the metal line (or the metal pattern) crossing the gate line, and the gate line, the parasitic capacitance due to a jumper that includes the metal line may be relatively less than a parasitic capacitance due to a jumper that includes a source/drain contact or a upper gate contact.

Referring to FIG. 8C, the integrated circuit 80c may include the first and second gate lines G81 and G82, from which dummy portions may be removed. For example, as illustrated in FIG. 8C, a portion of the first gate line G81 that includes a portion overlapping the second active region R82 in a perpendicular direction, may be removed from the first gate line G81 by a second cutting region CT82, wherein the first gate line G81 may be separated into a third partial gate line G81_1 and a first dummy gate line G81_2, to which the first input signal A is applied. Also, a portion of the second gate line G82 that includes a portion overlapping the first active region R81 in a perpendicular direction, may be removed from the second gate line G82 by a third cutting region CT83, wherein the second gate line G82 may be separated into a fourth partial gate line G82_2 and a second dummy gate line G82_1, to which the second input signal B is applied.

Figure 9A:
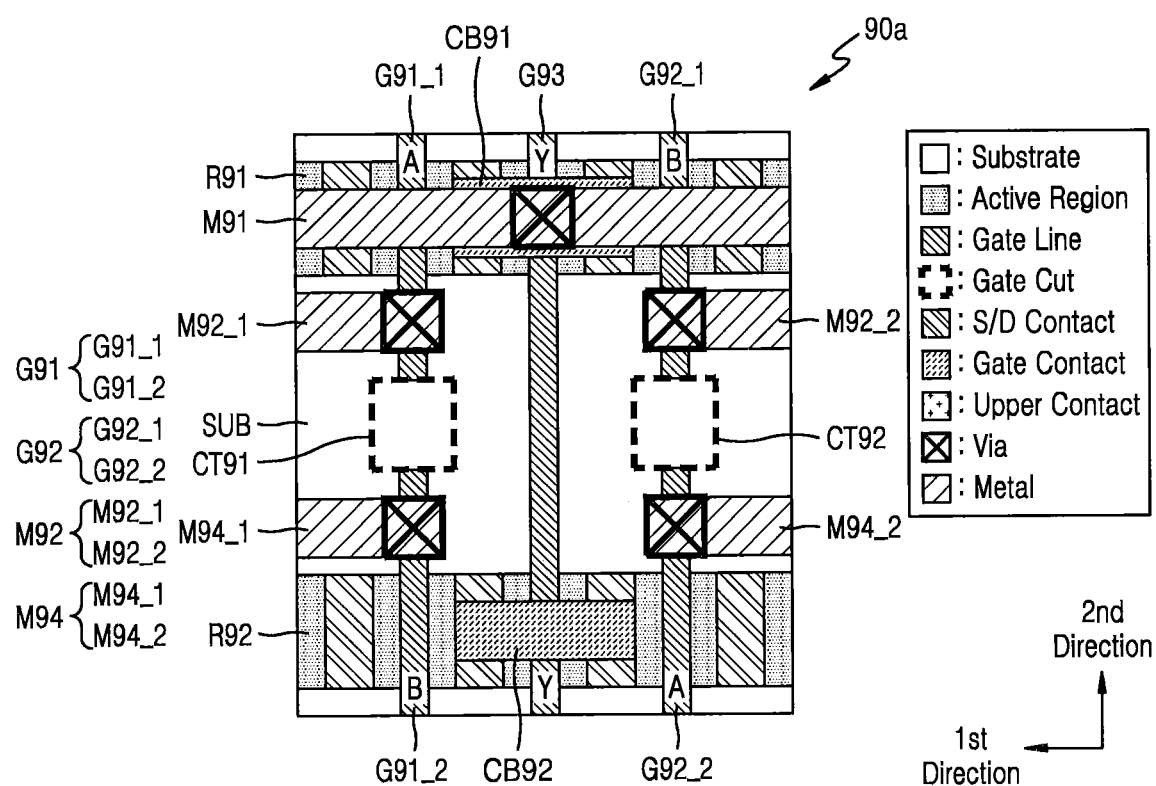
FIGS. 9A and 9B are schematic plan views of layouts of integrated circuits.
Figure 9B:
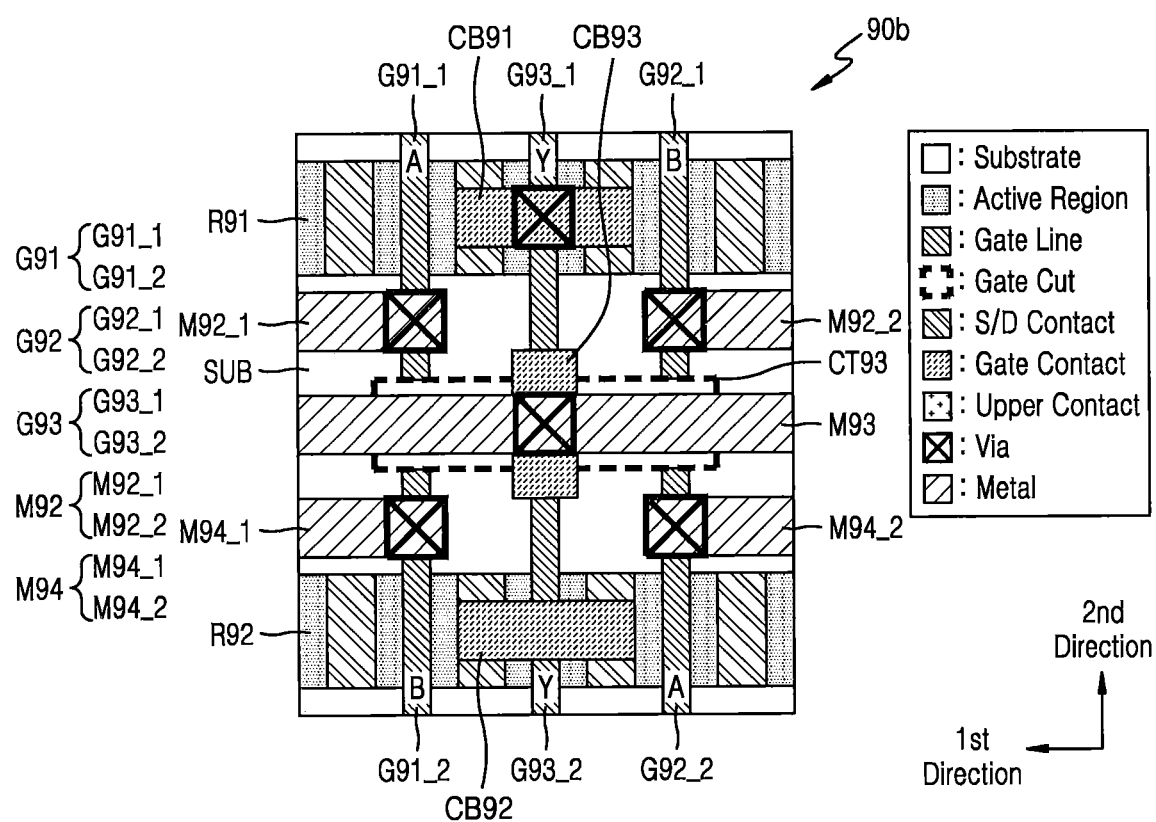

FIGS. 9A and 9B are schematic plan views of layouts of integrated circuits 90a and 90b, respectively, according to example embodiments. Specifically, FIGS. 9A and 9B illustrate cross-couple constructs available in the layouts having reduced sizes. Compared with the integrated circuits 80a, 80b, and 80c of FIGS. 8A through 8C, a third gate line G93 may be arranged between a first gate line G91 and a second gate line G92. The third gate line G93 in the integrated circuits 90a and 90b of FIGS. 9A and 9B may be used for routing an internal signal Y. Hereinafter, some aspects of the inventive concepts are described with reference to FIGS. 9A and 9B, and some aspects described elsewhere herein may not be repeatedly described.

Referring to FIG. 9A, the integrated circuit 90a may include first and second active regions R91 and R92, each extending in a first direction in parallel to each other, and the integrated circuit 90a may include the first through third gate lines G91, G92, and G93 extending in a second direction in parallel to one another. Also, the integrated circuit 90a may include first, second, and fourth metal lines M91, M92, and M94 extending in the first direction in parallel to one another. As illustrated in FIG. 9A, the second metal line M92 may include metal patterns M921 and M92_2, to which first and second input signals A and B are applied, respectively, and the fourth metal line M94 may include metal patterns M94_1 and M94_2, to which the second and first input signals B and A are applied, respectively. Although not shown in FIG. 9A, the integrated circuit 90a may further include a third metal line between the second and fourth metal lines M92 and M94 and a fifth metal line adjacent to the fourth metal line M94.

The first gate line G91 may include first and second partial gate lines G91_1 and G91_2 separated from each other by a first cutting region CT91, wherein the first and second input signals A and B may be applied to the first and second partial gate lines G91_1 and G91_2, respectively. Also, the second gate line G92 may include third and fourth partial gate lines G92_1 and G92_2 separated from each other by a second cutting region CT92, wherein the second and first input signals B and A may be applied to the third and fourth partial gate lines G92_1 and G92_2, respectively. The third gate line G93 may continually extend from the first active region R91 to the second active region R92 in the second direction.

The integrated circuit 90a may include a first jumper electrically connecting source/drain regions formed on the first active region R91 at both sides of the third gate line G93, wherein the first jumper may include a first gate contact CB91 crossing the third gate line G93 to extend in the first direction and having a bottom surface connected to the third gate line G93. Also, the integrated circuit 90a may include a second jumper electrically connecting source/drain regions formed on the second active region R92 at both sides of the third gate line G93, wherein the second jumper may include a second gate contact CB92 crossing the third gate line G93 to extend in the first direction and having a bottom surface connected to the third gate line G93. Accordingly, a node corresponding to an internal signal Y formed on the first active region R91 and a node corresponding to the internal signal Y formed on the second active region R92 may be electrically connected to each other via the third gate line G93, without using a metal line, so that routing congestion of the cross-couple construct may be decreased. As illustrated in FIG. 9A, the internal signal Y may be additionally routed via the first metal line M91.

Referring to FIG. 9B, the first and second gate lines G91 and G92 may be cut by one cutting region, that is, a third cutting region CT93. When, due to a semiconductor process, it is not easy to form a cutting region having a relatively shorter length in the first direction, such as the first and second cutting regions CT91 and CT92 illustrated in FIG. 9A, the third cutting region CT93 overlapping the first and second gate lines G91 and G92 may be formed, as illustrated in FIG. 9B.

Each of the first and second gate lines G91 and G92 may be cut by the third cutting region CT93, and also the third gate line G93 between the first and second gate lines G91 and G92 may be separated into fifth and sixth partial gate lines G93_1 and G93_2 by the third cutting region CT93. As illustrated in FIG. 9B, the integrated circuit 90b may include a third gate contact CB93 having a bottom surface connected to the fifth and sixth partial gate lines G93_1 and G93_2 and extending in the second direction, and thus, the fifth and sixth partial gate lines G93_1 and G93_2 may be electrically connected to each other by the third gate contact CB93. As illustrated in FIG. 9B, an internal signal Y may be additionally routed by the third metal line M93.

Figure 10A:
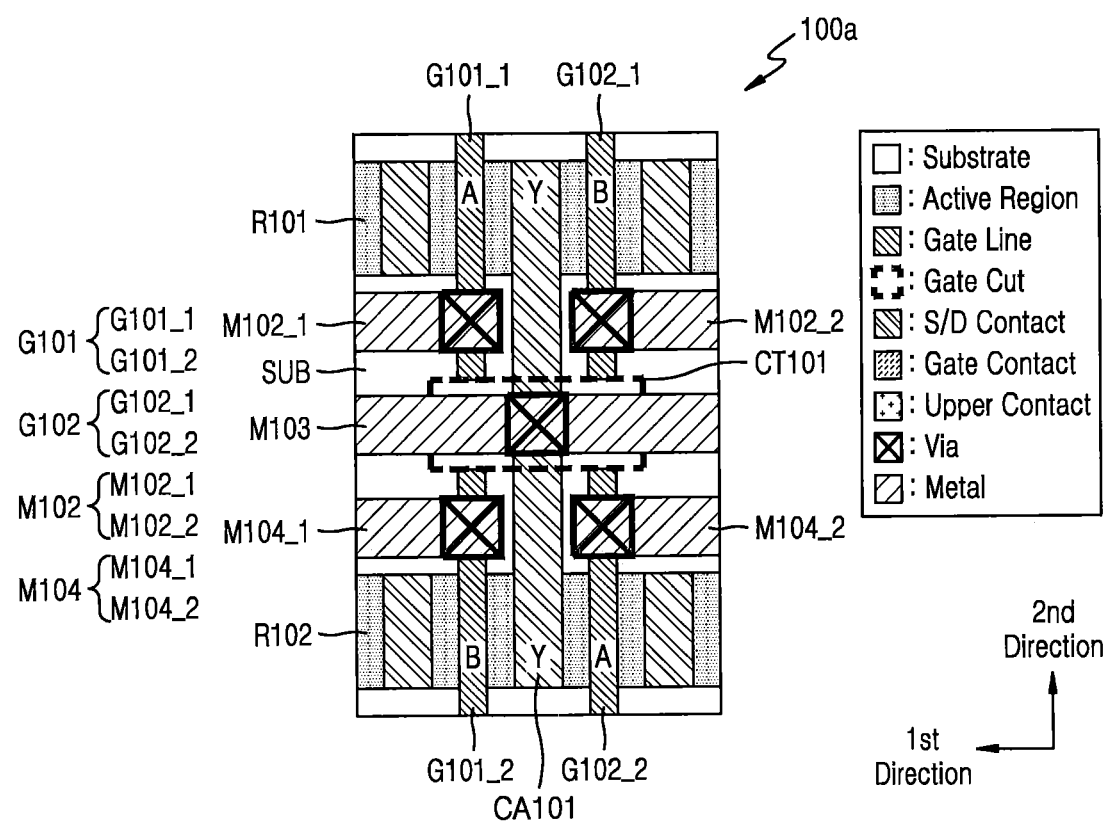
FIGS. 10A and 10B are schematic plan views of layouts of integrated circuits.
Figure 10B:
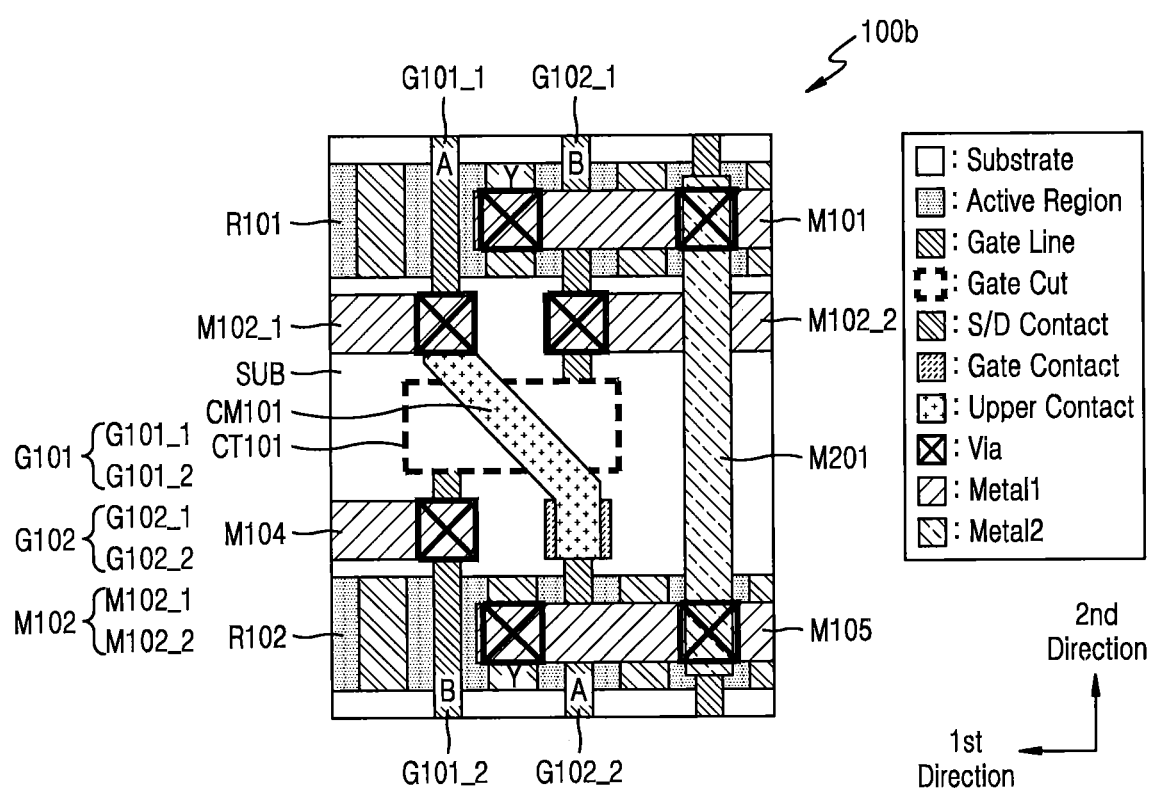

FIGS. 10A and 10B are schematic plan views of layouts of integrated circuits 100a and 100b, respectively, according to example embodiments. Specifically, FIGS. 10A and 10B show the layouts of the integrated circuits 100a and 100b that include two adjacent gate lines, that is, first and second gate lines G101 and G102 for first and second input signals A and B. Hereinafter, some aspects of the inventive concepts are described with reference to FIGS. 10A and 10B, and some aspects described elsewhere herein may not be repeatedly described.

Referring to FIG. 10A, the integrated circuit 100a may include first and second active regions R101 and R102 extending in a first direction in parallel to each other, and may include the first and second gate lines G101 and G102 extending in a second direction in parallel to each other. Also, the integrated circuit 100a may include second through fourth metal lines M102, M103, and M104 extending in the first direction in parallel to one another, wherein the second metal line M102 may include metal patterns M102_1 and M102_2, to which the first and second input signals A and B are applied, respectively, and the fourth metal line M104 may include metal patterns M104_1 and M104_2, to which the second and first input signals B and A are applied, respectively. Although not shown, the integrated circuit 100a may further include a first metal line adjacent to the second metal line M102 and a fifth metal line adjacent to the fourth metal line M104.

The first and second gate lines G101 and G102 may be cut by a first cutting region CT101, similarly to the embodiment described with reference to FIG. 9B. Accordingly, the first gate line G101 may include a first partial gate line G101_1, to which the first input signal A may be applied, and a second partial gate line G101_2, to which the second input signal B may be applied, and the second gate line G102 may include a third partial gate line G102_1, to which the second input signal B may be applied, and a fourth partial gate line G102_2, to which the first input signal A may be applied.

In some embodiments, in order to route an internal signal Y, a source/drain contact extending in the second direction may be used. For example, as illustrated in FIG. 10A, the integrated circuit 100a may include a first source/drain contact CA101 having a bottom surface connected to a first source/drain region and a second source/drain region, wherein the first source/drain region is shared by transistors formed by each of the first partial gate line G101_1 and the third partial gate line G102_1 with the first active region R101, and the second source/drain region is shared by transistors formed by each of the second partial gate line G101_2 and the fourth partial gate line G102_2 with the second active region R102. As illustrated in FIG. 10A, the first source/drain contact CA101 may continually extend from the first active region R101 to the second active region R102 in the second direction. Accordingly, a node corresponding to the internal signal Y formed on the first active region R101 and a node corresponding to the internal signal Y formed on the second active region R102 may be electrically connected to each other by the first source/drain contact CA101 without using a metal line, so that routing congestion of the cross-couple construct may be reduced. Also, based on the cross-couple construct realized by using two gate lines, the layout of the integrated circuit 100a may have a reduced area. As illustrated in FIG. 10A, the internal signal Y may be additionally routed by the third metal line M103.

Referring to FIG. 10B, a contact may be used to electrically connect partial gate lines of different gate lines, wherein the same input signal is applied to the partial gate lines of the different gate lines, in a cross-couple construct. As illustrated in FIG. 10B, in the integrated circuit 100b, the first partial gate line G101_1 and the fourth partial gate line G102_2, to which the first input signal A is applied, may be electrically connected to each other on the first cutting region CT101 by an upper contact CM101. In some embodiments, as illustrated in FIG. 10B, the upper contact CM101 may have a portion extending in a direction that is non-parallel to the first and second directions. In some embodiments, unlike the example of FIG. 10B, the upper contact CM101 may include portions extending in parallel to the first and second directions. The upper contact CM101 may be electrically connected to each of the first and fourth partial gate lines G101_1 and G102_2, via gate contacts. In some embodiments, the upper contact CM101 of FIG. 10B may be substituted by a middle contact (CC32 of FIG. 3E) having a top surface spaced apart from a via in a perpendicular direction. As illustrated in FIG. 10B, an internal signal Y may be routed by the first metal line M101 of a first metal layer M1 (e.g., Metal 1), a metal line M201 of a second metal layer M2, (e.g., Metal 2) and the fifth metal line M105 of the first metal layer M1.

Figure 11A:
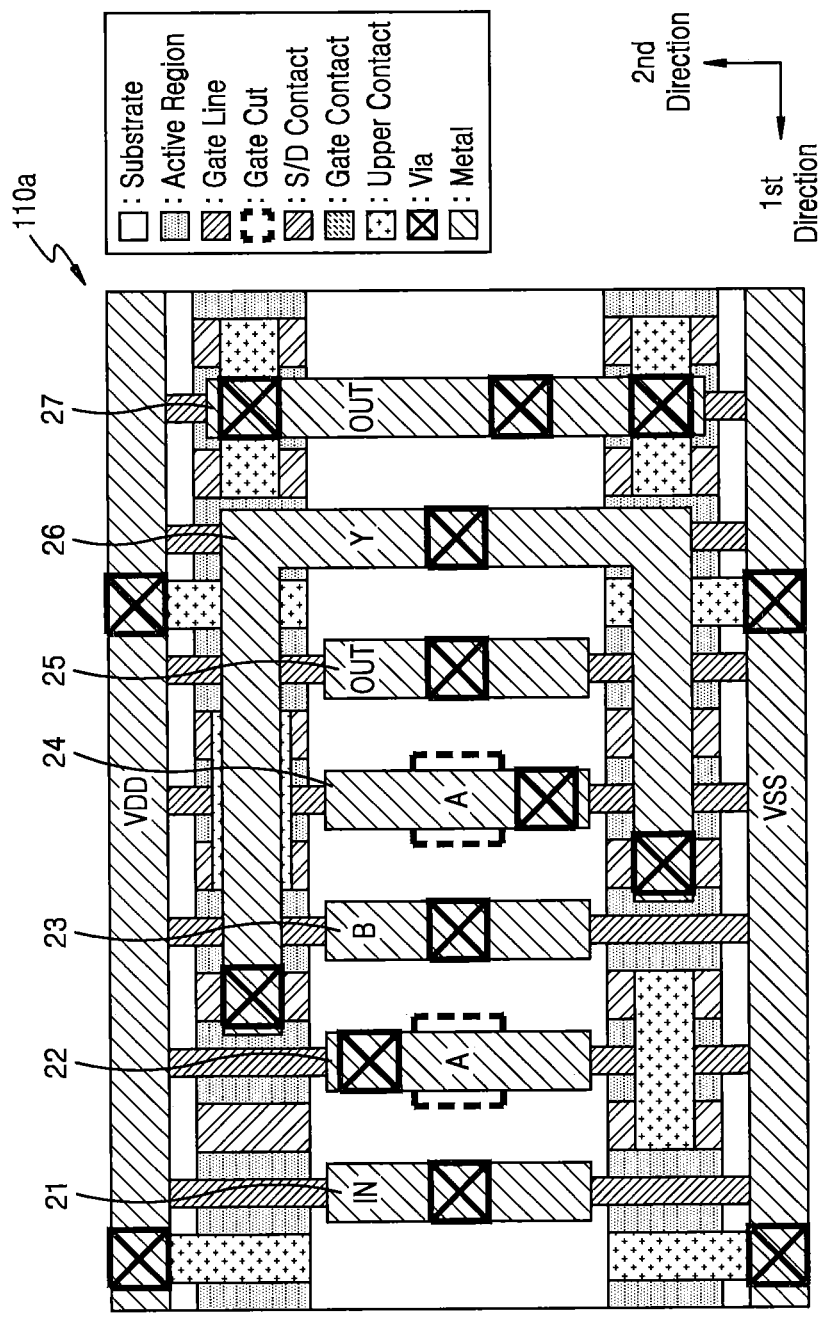
FIGS. 11A through 11C are schematic plan views of layouts of integrated circuits.
Figure 11B:
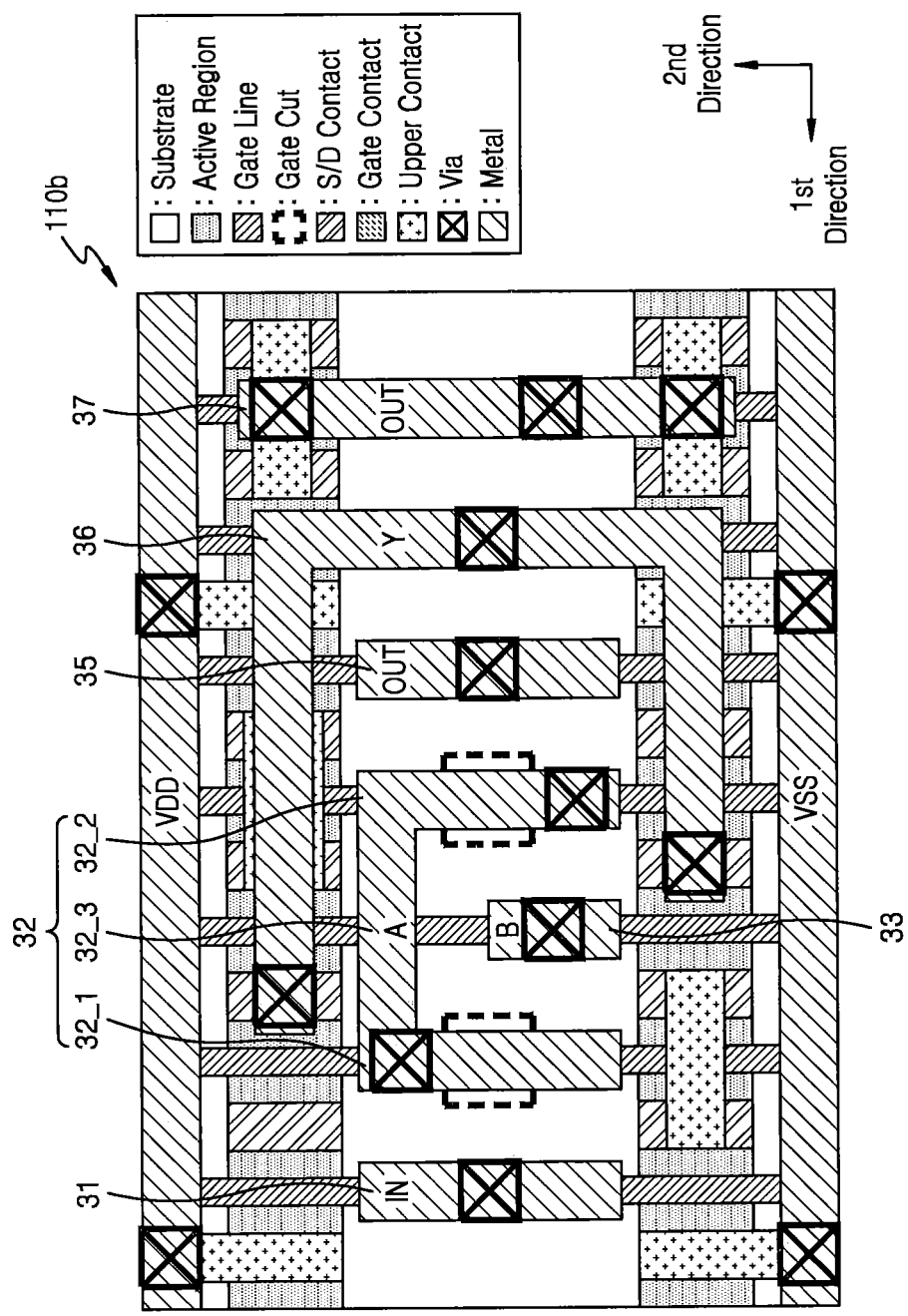
Figure 11C:
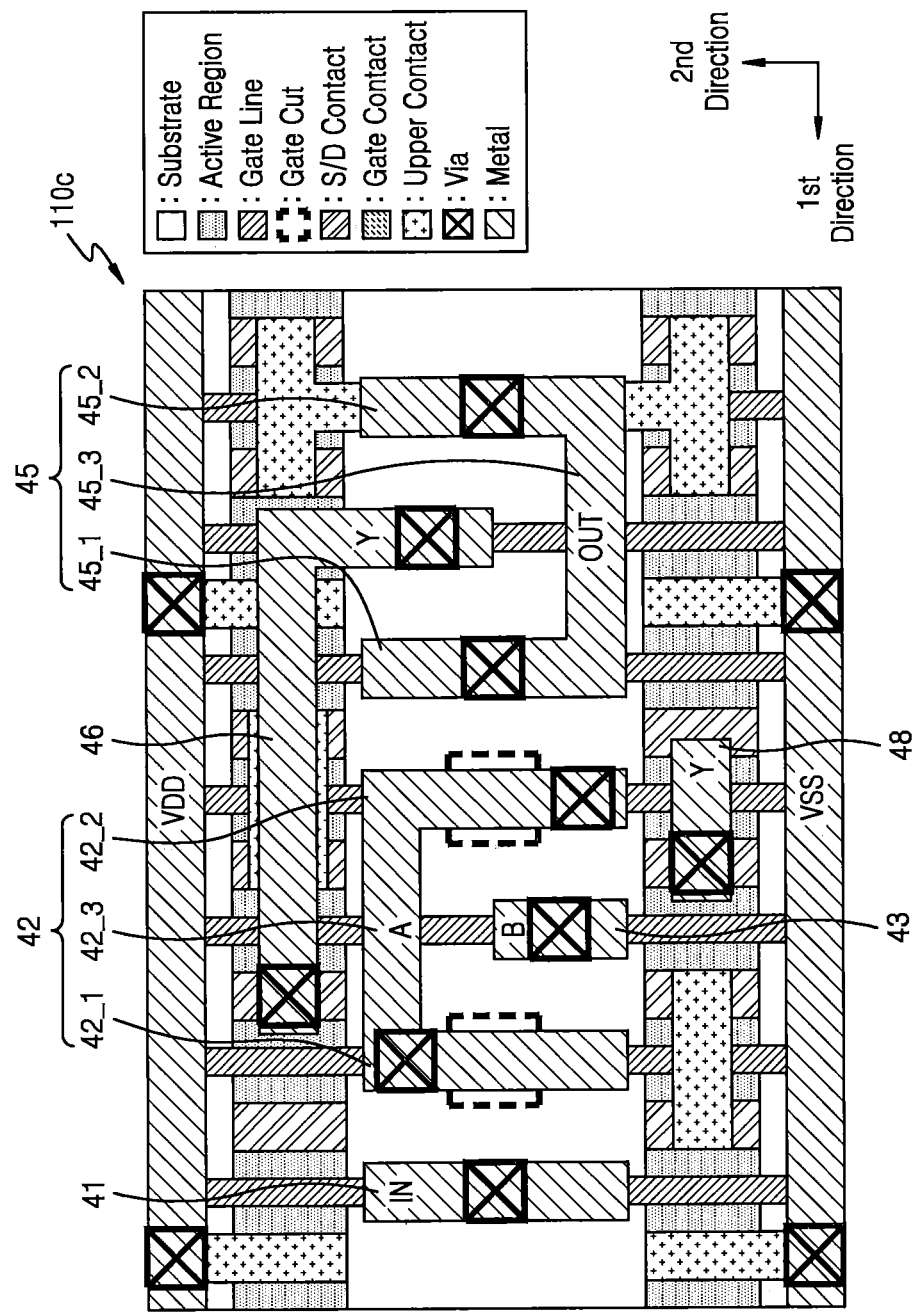

FIGS. 11A through 11C are schematic plan views of layouts of integrated circuits 110a, 110b, and 110c, respectively, according to example embodiments. Specifically, FIGS. 11A through 11C show examples of integrated circuits that include the latch 10' of FIG. 1B. The integrated circuits 110a, 110b, and 110c each includes cross-couple constructs and metal patterns for routing signals of the cross-couple constructs, wherein for convenience of illustration, only the metal patterns included in a lowermost wiring layer (for example, a layer M1) are illustrated. Similar to the embodiment described with reference to FIG. 2A, each of gate lines for a first input signal A may be separated by a cutting region in the integrated circuits 110a, 110b, and 110c. Hereinafter, the embodiments of FIGS. 11A through 11C will be described, with reference to FIG. 1B, and some aspects described elsewhere herein may not be repeatedly described.

Referring to FIG. 11A, the integrated circuit 110a may include a first metal pattern 21 for a latch input signal IN, a second metal pattern 22 and a fourth metal pattern 24 for the first input signal A, a third metal pattern 23 for a second input signal B, a fifth metal pattern 25 and a seventh metal pattern 27 for a latch output signal OUT, and a sixth metal pattern 26 for an internal signal Y. The first through fifth metal patterns 21 through 25 may have a shape in which the first through fifth metal patterns 21 through 25 extend in a second direction, for an arrangement of vias through which the first through fifth metal patterns 21 through 25 are connected to patterns of a upper wiring layer, as illustrated in FIG. 11A.

When the first through fifth metal patterns 21 through 25 for the latch input signal IN, the first and second input signals A and B, and the latch output signal OUT are arranged as illustrated in FIG. 11A, the integrated circuit 110a may include a greater number of metal patterns and vias included in the upper wiring layer, for the first through fifth metal patterns 21 through 25, compared with the integrated circuits 110b and 110c of FIGS. 11B and 11C to be described below. However, as will be described below with reference to FIGS. 11B and 11C, the number of metal patterns and vias may be decreased based on a shape of the metal patterns, which is provided with respect to a cross-couple construct, so that power consumption and routing congestion may be reduced.

Referring to FIG. 11B, the integrated circuit 110b may include a first metal pattern 31 for a latch input signal IN, a second metal pattern 32 for a first input signal A, a third metal pattern 33 for a second input signal B, a fifth metal pattern 35 and a seventh metal pattern 37 for a latch output signal OUT, and a sixth metal pattern 36 for an internal signal Y. Compared with the integrated circuit 110a of FIG. 11A, the integrated circuit 110b of FIG. 11B may include the second metal pattern 32 that is "C"-shaped or "U" shaped for the first input signal A. For example, as illustrated in FIG. 11B, the second metal pattern 32 may include first and second portions 32_1 and 32_2 each extending in a second direction, and a third portion 32_3 connected to ends of the first and second portions 32_1 and 32_2 and extending in a first direction.

Based on the third portion 32_3 of the second metal pattern 32, the third metal pattern 33 for the second input signal B may have a less length in the second direction, compared with the third metal pattern 23 of FIG. 11A. For example, the third metal pattern 33 of FIG. 11B may be referred to as an island pattern, and in some embodiments, the third metal pattern 33 may have a length in the second direction, that is less than a length according to a design rule. As illustrated in FIG. 11B, the second metal pattern 32 may be used to electrically connect two gate lines, to which the first input signal A is applied, in the cross-couple construct, and thus, additional patterns of an upper wiring layer may be omitted.

Referring to FIG. 11C, the integrated circuit 110c may include a first metal pattern 41 for a latch input signal IN, a second metal pattern 42 for a first input signal A, a third metal pattern 43 for a second input signal B, a fifth metal pattern 45 for a latch output signal OUT, and a sixth metal pattern 46 and an eighth metal pattern 48 for an internal signal Y. Compared with the integrated circuit 110b of FIG. 11B, the integrated circuit 110c of FIG. 11C may include not only the second metal pattern 42 for the first input signal A, but also the fifth metal pattern 45 having a "C" shape or "U" shape" for the latch output signal OUT. For example, as illustrated in FIG. 11C, the second metal pattern 42 may include first and second portions 42_1 and 42_2 each extending in the second direction and a third portion 42_3 connected to ends of the first and second portions 42_1 and 42_2 and extending in the first direction. Similarly, the fifth metal pattern 45 may include first and second portions 45_1 and 45_2 each extending in the second direction and a third portion 45_3 connected to ends of the first and second portions 45_1 and 45_2 and extending in the first direction. As illustrated in FIG. 11C, not only the second metal pattern 42, but also the fifth metal pattern 45 having the "C" shape or "U" shape are used in the cross-couple construct, and thus, additional patterns of an upper wiring layer may be omitted.

Figure 12:
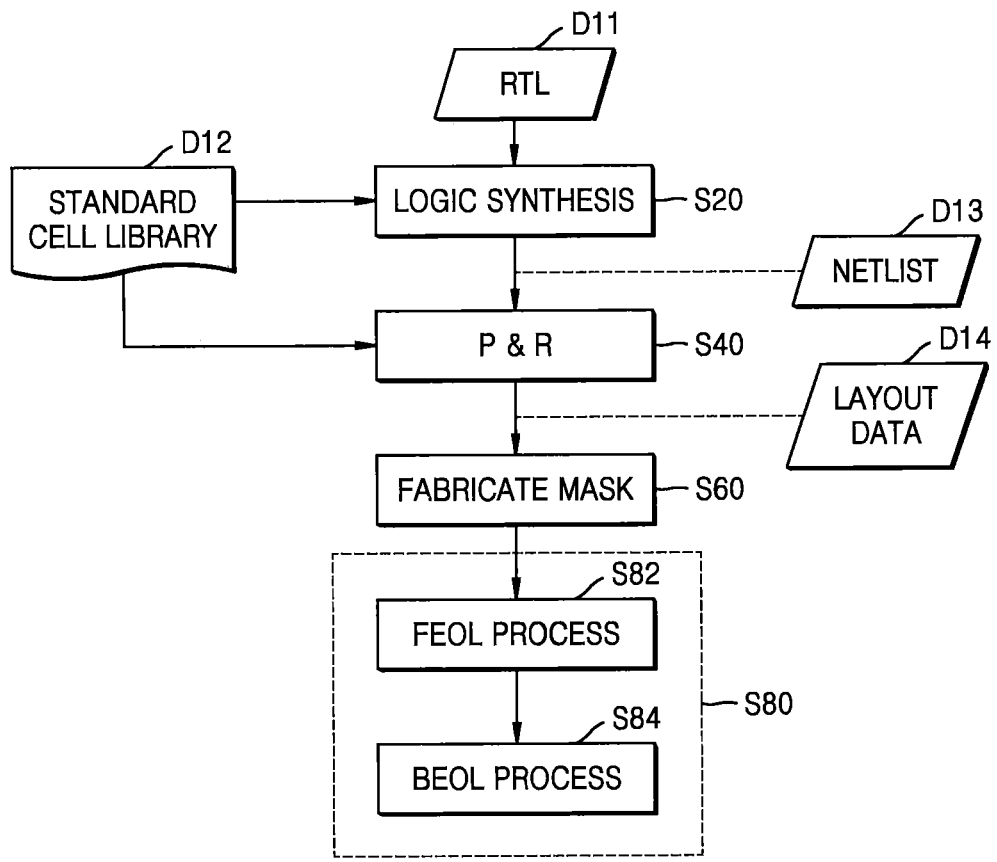
FIG. 12 is a flowchart of an example method of fabricating an integrated circuit including a standard cell configured to define a cross-couple construct.

FIG. 12 is a flowchart of a method of fabricating an integrated circuit including a standard cell configured to define a cross-couple construct, according to an example embodiment. A standard cell is a unit of a layout included in the integrated circuit, and the integrated circuit may include a plurality of various standard cells. The standard cells may have a structure in compliance with a predetermined rule. For example, as illustrated in FIG. 2A, the standard cell may include the first and second active regions R21 and R22 extending in the first direction in parallel to each other, and may have a predetermined length in the second direction. A standard cell library D12 of FIG. 12 may define the standard cells including the layouts of the cross-couple constructs according to the example embodiments of the inventive concepts described hereinabove with reference to the drawings.

In operation S20, a logic synthesis operation may be performed to generate netlist data D13 from RTL data D11.

For example, a semiconductor design tool (for example, a logic synthesis tool) may perform the logic synthesis operation on the RTL data D11 that is written in a hardware description language (HDL), such as a VHSIC HDL (VHDL) or Verilog, with reference to the standard cell library D12, in order to generate the netlist data D13 including a bitstream or a netlist. The standard cell library D12 may include information with respect to improved performance of the standard cells, based on a cross-couple construct having reduced parasitic capacitance and a simple internal routing structure. Also, with reference to this information, the standard cells may be included in the integrated circuit in the logic synthesis operation.

In operation S40, a place and routing (P&R) operation may be performed to generate layout data D14 from the netlist data D13. For example, a semiconductor design tool (for example, a P&R tool) may place a plurality of standard cells from the netlist data D13, with reference to the standard cell library D12, and may route input pins and output pins of the arranged plurality of standard cells. As described above, the layout of the standard cell including the cross-couple construct may include a decreased number of conductive patterns, such as vias and metal patterns, and thus, placement and routing with improved performance may be achieved based on reduced routing congestion. The layout data D14 may have a format, such as GDSII, and may include geometrical information of standard cells and interconnections.

In operation S60, an operation of manufacturing a mask may be performed. For example, optical proximity correction (OPC) may be applied to the layout data D14 in order to define patterns on the mask in order to form patterns on a plurality of layers, and at least one mask (or a photomask) for forming patterns of each of the plurality of layers may be manufactured.

In operation S80, an operation of fabricating the integrated circuit may be performed. For example, the integrated circuit may be fabricated by patterning the plurality of layers by using the at least one mask manufactured in operation S60. As illustrated in FIG. 12, operation S80 may include operations S82 and S84.

In operation S82, a front-end-of-line (FEOL) operation may be performed. The FEOL operation may refer to an operation of forming, on a substrate, separate devices, such as a transistor, a capacitor, a resistor, etc., in the process of fabricating the integrated circuit. For example, the FEOL operation may include planarizing and cleaning a wafer, forming a trench, forming a well, forming a gate line, forming source/drain regions, etc.

In operation S84, a back-end-of-line (BEOL) operation may be performed. The BEOL operation may refer to an operation of interconnecting separate devices, such as transistors, capacitors, resistors, etc., in the process of fabricating the integrated circuit. For example, the BEOL operation may include silicidating gate, source, and drain regions, adding a dielectric material, performing planarization, forming a hole, adding a metal layer, forming a via, forming a passivation layer, etc. Thereafter, the integrated circuit may be packaged in a semiconductor and may be used as parts of various applications.

Figure 13:
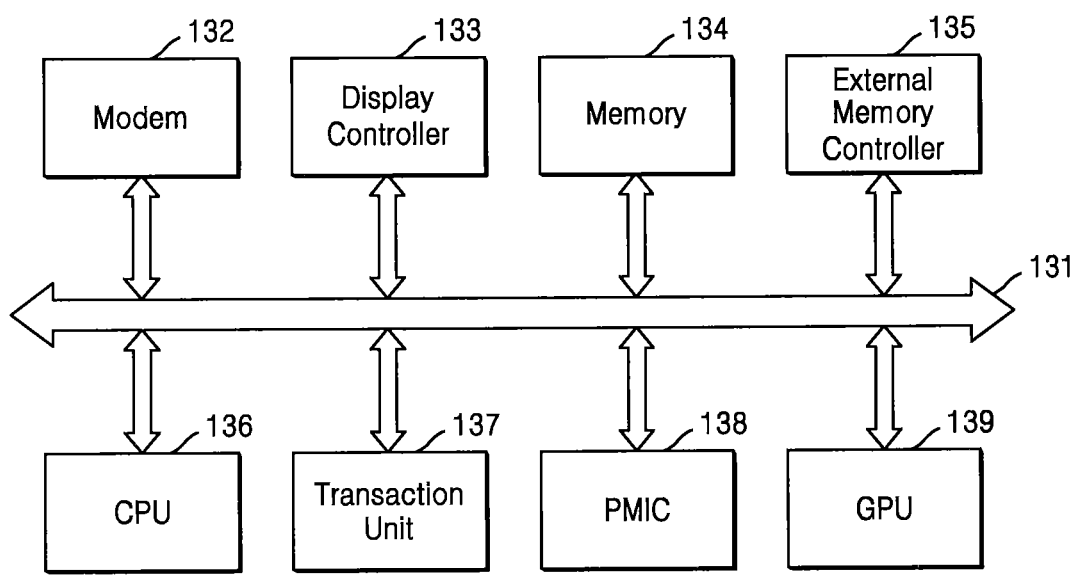
FIG. 13 is a block diagram of a system on chip (SoC).

FIG. 13 is a block diagram of a system on chip (SoC) 130 according to an example embodiment. The SoC 130 may be a semiconductor device and may include a cross-couple construct, or an integrated circuit including a cross-couple construct, according to an example embodiment of the inventive concepts. The SoC 130 may be a chip in which various exclusive functional blocks are realized, such as intellectual property (IP), and the cross-couple construct according to an example embodiment may be included in each of the functional blocks of the SoC 130, thereby improving performance and reducing power consumption of the SoC 130.

Referring to FIG. 13, the SoC 130 may include a modem 132, a display controller 133, a memory 134, an external memory controller 135, a central processing unit (CPU) 136, a transaction unit 137, a PMIC 138, and a graphics processing unit (GPU) 139, wherein each of the functional blocks, that is, the modem 132, the display controller 133, the memory 134, the external memory controller 135, the CPU 136, the transaction unit 137, the PMIC 138, and the GPU 139 may communicate with one another via a system bus 131.

The CPU 136 configured to generally control operations of the SoC 130 may control operations of the other functional blocks, that is, the modem 132, the display controller 133, the memory 134, the external memory controller 135, the transaction unit 137, the PMIC 138, and the GPU 139. The modem 132 may demodulate a signal received from outside the SoC 130, or modulate a signal generated inside the SoC 130 and transmit the modulated signal to the outside. The external memory controller 135 may control an operation of transmitting and receiving data to and from an external memory device connected to the SoC 130. For example, a program and/or data stored in the external memory device may be provided to the CPU 136 or the GPU 139 under control of the external memory controller 135. The GPU 139 may execute program instructions related to processing of graphics. The GPU 139 may receive graphics data via the external memory controller 135 and may transmit graphics data processed by the GPU 139 to the outside of the SoC 130 via the external memory controller 135. The transaction unit 137 may monitor data transaction of each functional block and the PMIC 138 may control power supplied to each functional block under control of the transaction unit 137. The display controller 133 may control an external display (or a display device) outside the SoC 130 and transmit data generated inside the SoC 130 to the display (or the display device).

The memory 134 may include nonvolatile memories, such as electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), etc., and volatile memories, such as dynamic random access memory (DRAM), static random access memory (SRAM), mobile DRAM, double data rate synchronous DRAM (DDR SDRAM), low power DDR (LPDDR) SDRAM, graphic DDR (GDDR) SDRAM, rambus DRAM (RDRAM), etc.

While the inventive concepts have been particularly shown and described with reference to embodiments thereof, it will be understood that various changes in form and details may be made therein without departing from the spirit and scope of the following claims.

What is claimed is:
1. An integrated circuit comprising:
a first active region and a second active region, each extending on a substrate in a first horizontal direction, wherein the first active region and the second active region extend in parallel and have conductivity types different from each other;

a first gate line extending in a second horizontal direction that crosses the first horizontal direction, wherein the first gate line forms, with the first active region, a first transistor, and wherein the first transistor comprises a gate configured to receive a first input signal;

a second gate line extending in the second horizontal direction, wherein the second gate line forms, with the second active region, a second transistor, and wherein the second transistor comprises a gate configured to receive the first input signal; and a third gate line continually extending in the second horizontal direction from the first active region to the second active region, between the first and second gate lines, and forming, with the first and second active regions, a third transistor and a fourth transistor, respectively, wherein each of the third and fourth transistors comprises a gate configured to receive a second input signal, wherein the first gate line comprises a first partial gate line that overlaps the first active region in a third direction perpendicular to the first horizontal direction and the second horizontal direction, and wherein the first partial gate line comprises an end on a region between the first and second active regions, wherein the second gate line comprises a second partial gate line overlapping the second active region in the third direction and having an end on a region between the first and second active regions, the second gate line further comprising a second dummy gate line having at least a portion that overlaps the first active region in the third direction and that is spaced apart from the second partial gate line, wherein a portion of the first active region that is between the second partial gate line and the second dummy gate line is free of overlap, in the third direction, from the second gate line, and wherein the integrated circuit further comprises a second jumper electrically interconnecting source/drain regions arranged on the first active regions at both sides of the second dummy gate line.

2. The integrated circuit of claim 1, wherein the first gate line further comprises a first dummy gate line that comprises at least a portion which overlaps the second active region in the third direction and is spaced apart from the first partial gate line, the integrated circuit further comprising:

a first jumper electrically interconnecting source/drain regions arranged on the second active region at both sides of the first dummy gate line.

3. The integrated circuit of claim 2, wherein the first jumper comprises:

source/drain contacts having bottom surfaces connected to the source/drain regions, respectively.

4. The integrated circuit of claim 3, wherein the first jumper comprises:

an upper contact extending in the first horizontal direction and having a bottom surface connected to the source/drain contacts.

5. The integrated circuit of claim 1, further comprising:

an interconnection electrically connecting the gates of the first and second transistors, wherein the interconnection comprises a first metal pattern that includes a first portion and a second portion extending in the second horizontal direction on the first and second gate lines, respectively, and a third portion connected to ends of the first and second portions and extending in the first horizontal direction.

6. The integrated circuit of claim 5, further comprising:

a second metal pattern electrically connected to the third gate line and extending in the second horizontal direction between the first and second portions of the first metal pattern.

7. The integrated circuit of claim 6, wherein the second metal pattern has a length in the second horizontal direction, which is less than a length based on a design rule.

8. An integrated circuit comprising:

a first active region and a second active region, each extending on a substrate in a first horizontal direction, wherein the first active region and the second active region extend in parallel and have conductivity types different from each other;

a first gate line extending in a second horizontal direction that crosses the first horizontal direction, wherein the first gate line comprises a first partial gate line that forms, with the first active region, a first transistor having a gate configured to receive a first input signal, and wherein the first gate line further comprises a first dummy portion which overlaps the second active region in a third direction and is insulated from the first partial gate line;

a second gate line extending in the second horizontal direction, wherein the second gate line comprises a second partial gate line that forms, with the second active region, a second transistor having a gate configured to receive the first input signal, and wherein the second gate line further comprises a second dummy portion which overlaps the first active region in the third direction and is insulated from the second partial gate line; and a third gate line continually extending in the second horizontal direction from the first active region to the second active region, between the first and second gate lines, and forming, with the first and second active regions, a third transistor and a fourth transistor, respectively, wherein each of the third and fourth transistors comprises a gate configured to receive a second input signal, wherein a portion of the first active region between the second partial gate line and the second dummy portion is free of overlap, in the third direction, from the second gate line.

9. The integrated circuit of claim 8, further comprising:

a first jumper electrically interconnecting source/drain regions arranged on the second active region at both sides of the first dummy portion of the first gate line.

10. An integrated circuit comprising:

a first active region and a second active region, each extending on a substrate in a first horizontal direction, wherein the first active region and the second active region extend in parallel and have conductivity types different from each other;

a first gate line extending in a second horizontal direction that crosses the first horizontal direction, wherein the first gate line comprises a first partial gate line that forms, with the first active region, a first transistor having a gate configured to receive a first input signal, and wherein the first gate line further comprises a first dummy portion which overlaps the second active region in a third direction and is separated from the first partial gate line by a first cutting region;

a second gate line extending in the second horizontal direction, wherein the second gate line comprises a second partial gate line that forms, with the second active region, a second transistor having a gate configured to receive the first input signal, wherein the second gate line further comprises a second dummy portion which overlaps the first active region in the third direction and is separated from the second partial gate line by a second cutting region, and wherein a portion of the first active region between the second partial gate line and the second dummy portion is free of overlap, in the third direction, from the second gate line; and a third gate line continually extending in the second horizontal direction from the first active region to the second active region, between the first and second gate lines, and forming, with the first and second active regions, a third transistor and a fourth transistor, respectively, wherein each of the third and fourth transistors comprises a gate configured to receive a second input signal; and a fourth gate line continually extending in the second horizontal direction from the first active region to the second active region, between the first and second gate lines, and forming, with the first and second active regions, a fifth transistor and a sixth transistor, respectively, wherein each of the fifth and sixth transistors comprises a gate configured to receive the second input signal.

11. The integrated circuit of claim 10, wherein the first and second cutting regions are located at different distances in the second horizontal direction from the second active region.

* * * * *